(12) United States Patent
Uehara

(10) Patent No.: US 9,837,489 B2
(45) Date of Patent: Dec. 5, 2017

(54) METHOD OF MANUFACTURING SEMICONDUCTOR DEVICE

(71) Applicant: KABUSHIKI KAISHA TOSHIBA, Tokyo (JP)

(72) Inventor: Junichi Uehara, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/061,975

(22) Filed: Mar. 4, 2016

(65) Prior Publication Data

US 2017/0076947 A1    Mar. 16, 2017

(30) Foreign Application Priority Data

Sep. 11, 2015   (JP) ................. 2015-179329

(51) Int. Cl.
*H01L 29/06*  (2006.01)
*H01L 21/02*  (2006.01)
*H01L 21/306*  (2006.01)
*H01L 21/3065*  (2006.01)
*H01L 21/04*  (2006.01)

(52) U.S. Cl.
CPC .... *H01L 29/0634* (2013.01); *H01L 21/02529* (2013.01); *H01L 21/046* (2013.01); *H01L 21/3065* (2013.01); *H01L 21/30604* (2013.01); *H01L 21/30625* (2013.01)

(58) Field of Classification Search
CPC .......... H01L 29/0634; H01L 21/02529; H01L 21/046
See application file for complete search history.

(56) References Cited

U.S. PATENT DOCUMENTS 8,772,112 B1    7/2014   Chun et al.

FOREIGN PATENT DOCUMENTS

| JP | 2001-144292 | 5/2001 |
| JP | 2012-164707 | 8/2012 |

*Primary Examiner* — Amar Movva
(74) *Attorney, Agent, or Firm* — Patterson & Sheridan, LLP

(57) ABSTRACT

A method of manufacturing a semiconductor device includes forming a second SiC layer of a first conductivity type on a first SiC layer by epitaxial growth, forming a first region of a second conductivity type by selectively ion-implanting first impurities of the second conductivity type into the second SiC layer, removing a portion of the first region, forming a third SiC layer of the first conductivity type on the second SiC layer by epitaxial growth, and forming a second region of the second conductivity type on the first region by selectively ion-implanting second impurities of the second conductivity type into the third SiC layer.

15 Claims, 21 Drawing Sheets

_US 9,837,489 B2_

METHOD OF MANUFACTURING SEMICONDUCTOR DEVICE

CROSS-REFERENCE TO RELATED APPLICATION

This application is based upon and claims the benefit of priority from Japanese Patent Application No. 2015-179329, filed Sep. 11, 2015, the entire contents of which are incorporated herein by reference.

FIELD

Embodiments described herein relate generally to a method of manufacturing a semiconductor device.

BACKGROUND

Power control semiconductor devices that can achieve both a high breakdown voltage and a low on-resistance include a vertical metal oxide semiconductor field effect transistor (MOSFET) having a super junction structure (hereinafter, also referred to as an "SJ structure") in which a p type (or n type) semiconductor layer is embedded in an n type (or p type) semiconductor layer and n type regions and p type regions are alternately arranged. In the SJ structure, a wide depletion region is formed by equalizing the amount of n type impurities included in the n type region to the amount of p type impurities included in the p type region to realize a high breakdown voltage. In addition, it is possible to realize a low on-resistance by providing a high impurity concentration region to which a current is applied. In order to stably realize a high breakdown voltage, it is preferable to form the n type and p type regions having a uniform impurity concentration.

DETAILED DESCRIPTION

Figure 1:
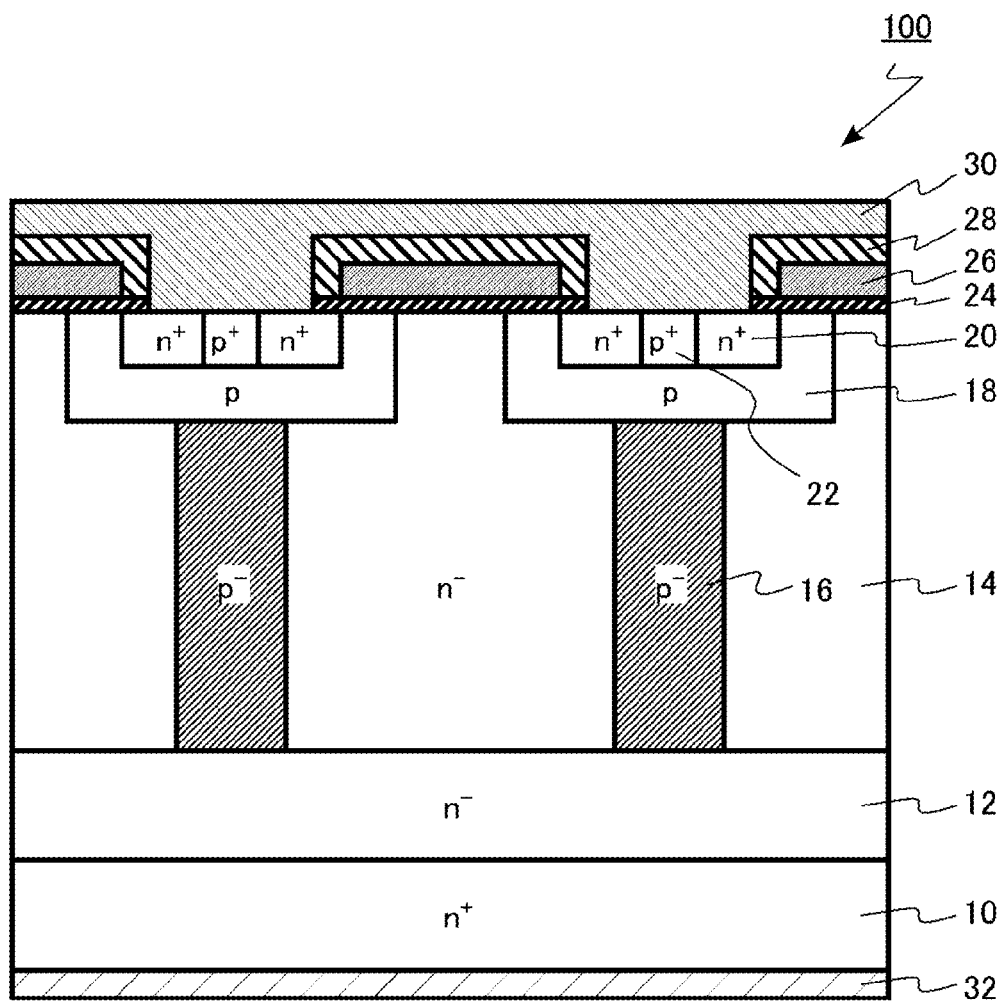
FIG. 1 is a schematic cross-sectional view of a semiconductor device manufactured by a method of manufacturing a semiconductor device, according to a first embodiment.

Embodiments provide a method of manufacturing a semiconductor device capable of realizing a high breakdown voltage.

In general, according to one embodiment, a method of manufacturing a semiconductor device, the method including forming a second SiC layer of a first conductivity type on a first SiC layer by epitaxial growth, forming a first region of a second conductivity type by selectively ion-implanting first impurities of the second conductivity type into the second SiC layer, removing a portion of the first region, forming a third SiC layer of the first conductivity type on the second SiC layer by epitaxial growth, and forming a second region of the second conductivity type on the first region by selectively ion-implanting second impurities of the second conductivity type into the third SiC layer.

Hereinafter, embodiments will be described with reference to the accompanying drawings. In the following description, the same or similar elements are denoted by the same reference numerals and signs, and a description of elements described once will only be repeated as needed.

In addition, in the following description, signs of $n^+$, n, $n^-$, $p^+$, p, and $p^-$ indicate relative levels of impurity concentrations of the respective conductivity types. That is, $n^+$ has an n type impurity concentration higher than that of n and $n^-$ has an n type impurity concentration lower than that of n. In addition, $p^+$ has a p type impurity concentration higher than that of p and $p^-$ has a p type impurity concentration lower than that of p. Meanwhile, the $n^+$ type and the $n^-$ type may be simply referred to as an n type, and the $p^+$ type and the $p^-$ type may be simply referred to as a p type.

First Embodiment

In a method of manufacturing a semiconductor device according to the present embodiment, a second SiC layer of a first conductivity type is formed on a first SiC layer by epitaxial growth, first impurities of a second conductivity type are selectively ion-implanted into a second SiC layer to form a first region of the second conductivity type, a portion of the first region is removed to form a third SiC layer of the first conductivity type on the second SiC layer by epitaxial growth, and second impurities of the second conductivity type are selectively ion-implanted into the third SiC layer to form a second region of the second conductivity type on the first region.

FIG. 1 is a schematic cross-sectional view of a semiconductor device manufactured by the method of manufacturing a semiconductor device, according to the present embodiment. The semiconductor device manufactured by the method according to the present embodiment is a vertical MOSFET 100 that has a super junction structure using silicon carbide (SiC). In the description hereinafter, an example will be given in which a first conductivity type is an n type and a second conductivity type is a p type.

The MOSFET 100 includes an $n^+$ type SiC substrate 10, an $n^-$ type buffer layer 12, an $n^-$ type drift region 14, a $p^-$ type pillar region 16, a p type body region 18, an $n^+$ type source region 20, a $p^+$ type contact region 22, a gate insulating film 24, a gate electrode 26, an interlayer film 28, a source electrode 30, and a drain electrode 32.

The MOSFET 100 is configured such that the $n^-$ type drift region 14 and the $p^-$ type pillar region 16 are depleted during a turn-off operation to form a wide depletion region, to thereby realize a high breakdown voltage. In addition, it is possible to increase the impurity concentration of the $n^-$ type drift region 14 by providing the p⁻ type pillar region 16. Therefore, it is possible to realize a low on-resistance during a turn-on operation.

The n⁻ type drift region 14 contains n type impurities. The n type impurity is, for example, nitrogen (N). The impurity concentration of the n type impurity is, for example, equal to or higher than $1 \times 10^{15}$ cm³ and equal to or lower than $1 \times 10^{17}$ cm⁻³.

The p⁻ type pillar region 16 contains p type impurities. The p type impurity is, for example, aluminum (Al). The impurity concentration of the p type impurity is, for example, equal to or higher than $1 \times 10^{15}$ cm⁻³ and equal to or lower than $1 \times 10^{18}$ cm⁻³.

FIGS. 2 to 4 and FIGS. 6 to 13 are schematic cross-sectional views of the semiconductor device during manufacturing according to the present embodiment. FIG. 5 is a diagram illustrating an example of a concentration profile in a depth direction when aluminum in SiC is ion-implanted.

First, the n⁺ type SiC substrate 10 is prepared. The SiC substrate 10 is, for example, a 4H—SiC single crystal substrate. For example, the surface of the SiC substrate 10 is a surface which is inclined at equal to or greater than 0 degrees and equal to or less than 8 degrees with respect to a (0001) surface.

Figure 2:
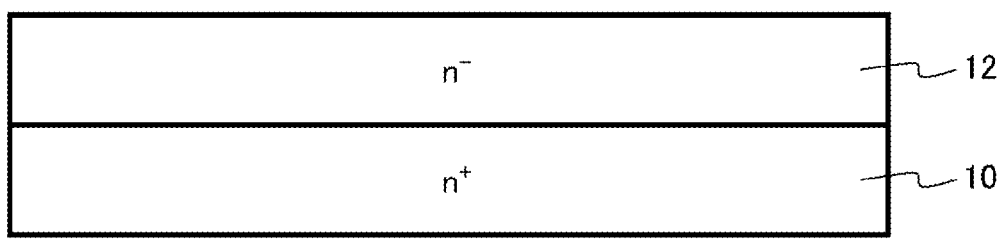
FIGS. 2-4 are each a schematic cross-sectional view of the semiconductor device during manufacturing according to the first embodiment.

Next, the n⁻ type buffer layer (first SiC layer) 12 is formed on the SiC substrate 10 (FIG. 2). The buffer layer 12 is formed by an epitaxial growth method. A film thickness of the buffer layer 12 is, for example, equal to or greater than 0.1 μm and equal to or less than 1.0 μm.

Figure 3:
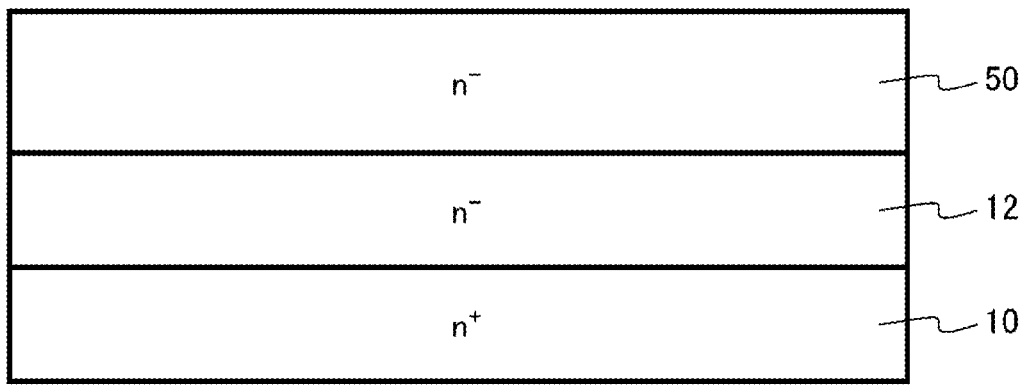

Next, an n⁻ type first n type epitaxial layer (second SiC layer) 50 is formed on the buffer layer 12 (FIG. 3). The first n type epitaxial layer 50 is formed by an epitaxial growth method. A film thickness of the first n type epitaxial layer 50 is, for example, equal to or greater than 0.1 μm and equal to or less than 1.0 μm.

Next, a mask material 60 is formed on the first n type epitaxial layer 50. The mask material 60 is, for example, a silicon oxide film.

Figure 4:
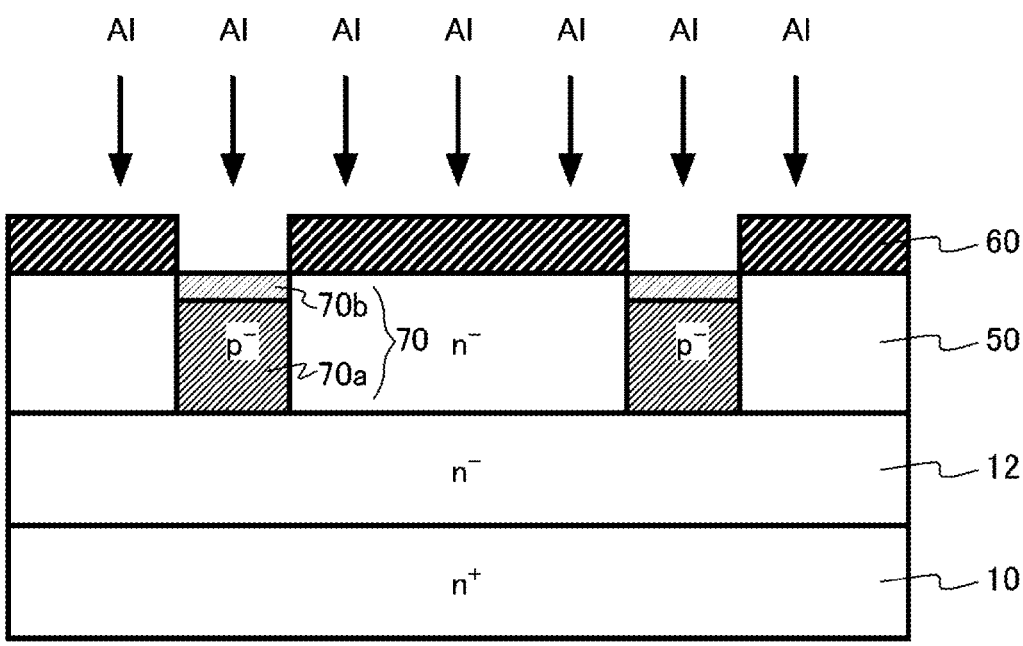
Figure 5:
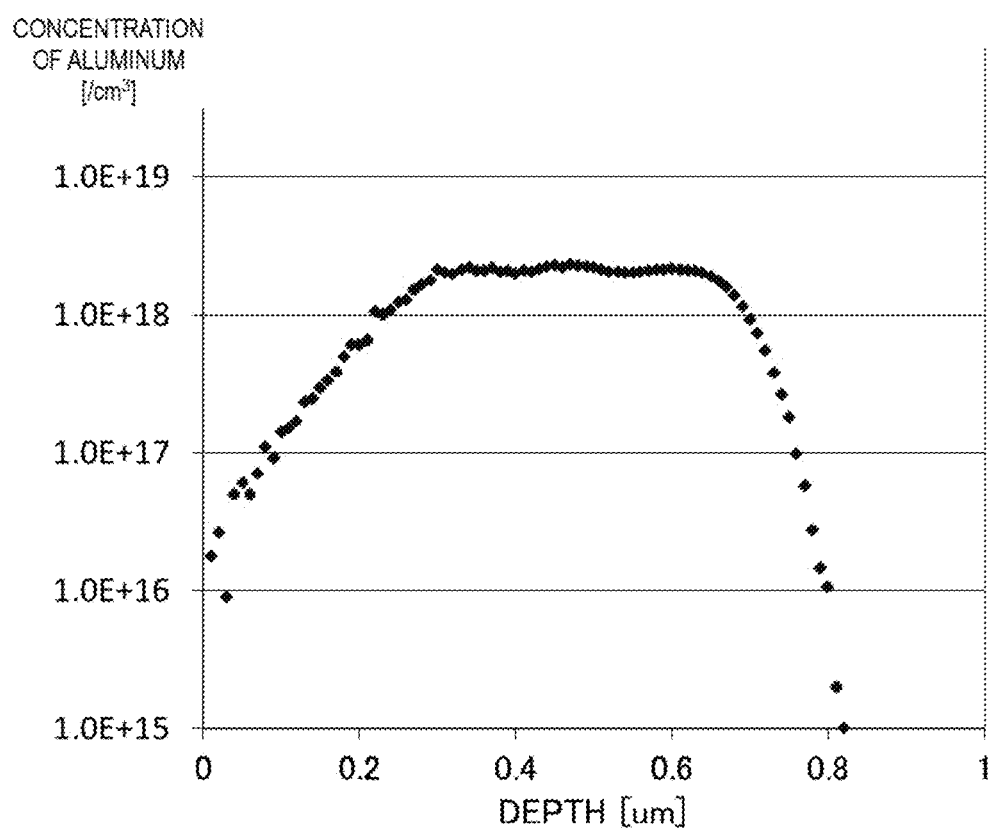
FIG. 5 is a diagram illustrating an example of a concentration profile in a depth direction when aluminum in SiC is ion-implanted.

Next, aluminum (first impurity) is selectively ion-implanted into the first n type epitaxial layer 50 using the mask material 60 as a mask (FIG. 4). A p⁻ type first p type region (first region) 70 is formed in the first n type epitaxial layer 50 by the ion implantation of aluminum. The first p type region 70 includes a high impurity concentration region 70a and a low impurity concentration region 70b.

The ion implantation of aluminum may be performed a plurality of times while changing acceleration energy so that the concentration of aluminum in the first p type region 70 becomes uniform in a film thickness direction.

FIG. 5 is a diagram illustrating an example of a concentration profile in a depth direction when aluminum in SiC is ion-implanted. When a peak concentration is present at a position separated from the surface at approximately 0.2 μm, a low impurity concentration region having, for example, an aluminum concentration set to be equal to or less than half of the peak concentration is formed in a range separated from the surface at approximately 0.1 μm.

A diffusion coefficient of the impurities in SiC is smaller than, for example, a diffusion coefficient of impurities in silicon (Si). In particular, a diffusion coefficient of aluminum in SiC is extremely small. Therefore, even when activation annealing of impurities is performed after ion implantation, there is an extremely small change in a concentration profile immediately after the ion implantation.

Figure 6:
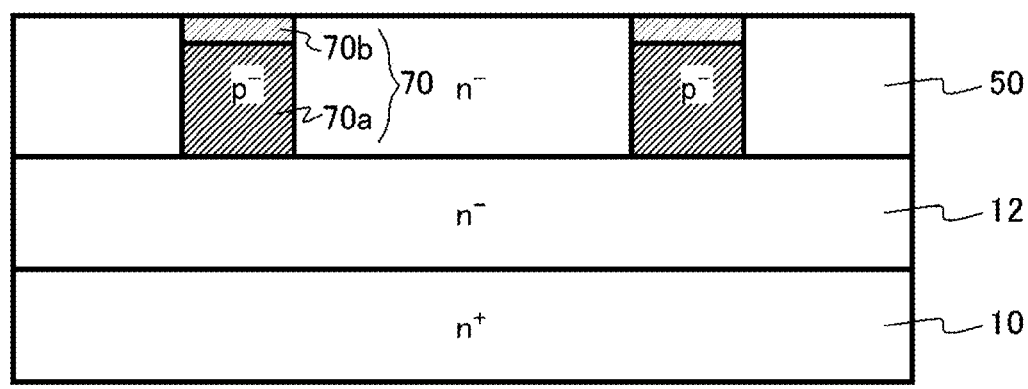
FIGS. 6-13 are each a schematic cross-sectional view of the semiconductor device during manufacturing according to the first embodiment.

Next, the mask material 60 is peeled off (FIG. 6). The peeling-off of the mask material is performed by, for example, wet etching.

Next, activation annealing for activating the ion-implanted aluminum is performed. The activation annealing is performed at a temperature of equal to or higher than 1,700° C. and equal to or lower than 1,900° C., for example, in a non-oxidizing atmosphere.

Figure 7:
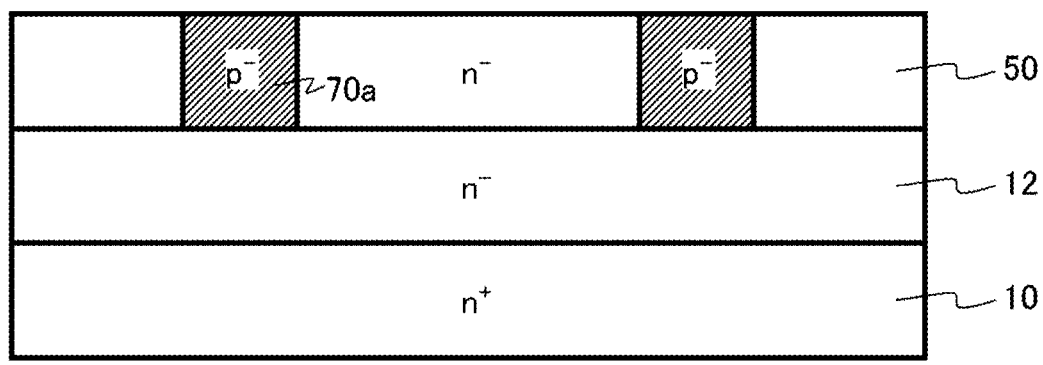

Next, the surface of the first n type epitaxial layer 50 is polished by chemical mechanical polishing (CMP), and the low impurity concentration region 70b which is a portion of the first p type region 70 is removed (FIG. 7).

When a portion of the first p type region 70 is removed by CMP, it is preferable to remove a region in which a peak concentration position of aluminum is present in the portion of the first p type region 70. A thickness of the portion of the first p type region 70 which is removed is, for example, equal to or greater than 0.05 μm and equal to or less than 0.2 μm.

It is preferable to perform CMP under a process condition having a high chemical etching component. For example, it is preferable to include a hydrogen peroxide solution ($H_2O_2$) with slurry. After the portion of the first p type region 70 is removed by CMP, any one or a combination of isotropic dry etching, anisotropic dry etching using a condition having a strong chemical action, the formation and peeling-off of a thermal oxide film, and wet etching, may be performed.

After the portion of the first p type region 70 is removed by CMP, isotropic dry etching may be performed. A portion of the first n type epitaxial layer 50 is removed by isotropic dry etching.

Damages such as scratches generated in the first n type epitaxial layer 50 due to CMP are removed by isotropic dry etching. Thereafter, the crystallizability of the SiC layer epitaxially grown on the first n type epitaxial layer 50 is improved.

The isotropic dry etching is, for example, chemical dry etching (CDE).

After the portion of the first p type region 70 is removed by CMP, anisotropic dry etching using a condition having a strong chemical action may be performed. A portion of the first n type epitaxial layer 50 is removed by anisotropic dry etching having a strong chemical action.

Damages such as scratches generated in the first n type epitaxial layer 50 due to CMP are removed by anisotropic dry etching using a condition having a strong chemical action. Thereafter, the crystallizability of the SiC layer epitaxially grown on the first n type epitaxial layer 50 is improved.

The anisotropic dry etching using a condition having a strong chemical action is, for example, reactive ion etching (RIE) using a sulfur hexafluoride ($SF_6$) gas or a carbon tetrafluoride ($CF_4$) gas.

After the portion of the first p type region 70 is removed by CMP, a thermal oxide film may be formed on the first n type epitaxial layer 50 and then peeled off. A portion of the first n type epitaxial layer 50 is removed by the formation and peeling-off of the thermal oxide film.

Damages such as scratches generated in the first n type epitaxial layer 50 due to CMP are removed by the formation and peeling-off of the thermal oxide film. Thereafter, the crystallizability of the SiC layer epitaxially grown on the first n type epitaxial layer 50 is improved.

After the portion of the first p type region 70 is removed by CMP, wet etching may be performed. A portion of the first n type epitaxial layer 50 is removed by wet etching.

Damages such as scratches generated in the first n type epitaxial layer 50 due to CMP are removed by wet etching. Thereafter, the crystallizability of the SiC layer epitaxially grown on the first n type epitaxial layer 50 is improved.

The wet etching is, for example, etching using nitrohydrofluoric acid (HF+HNO$_3$) as a liquid chemical.

Figure 8:
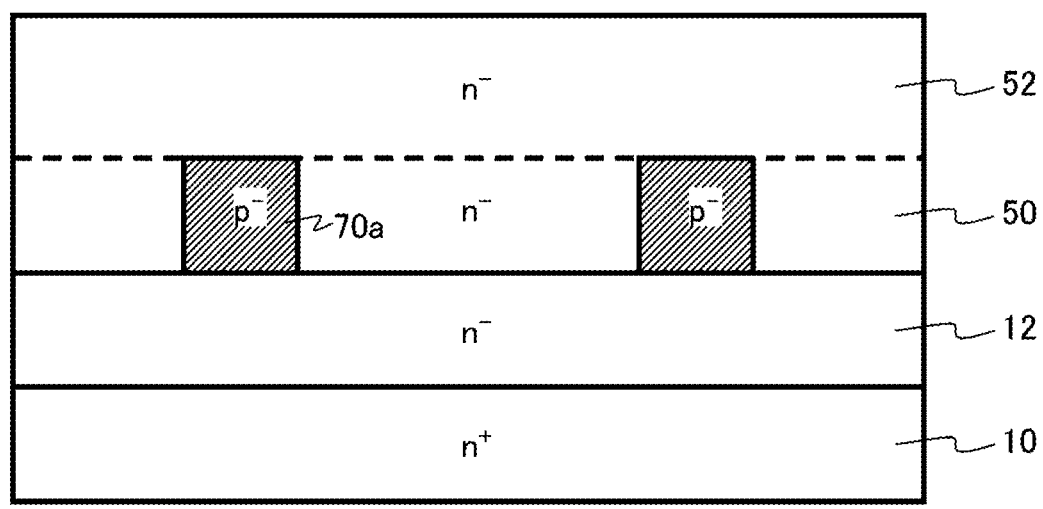

Next, an n$^-$ type second n type epitaxial layer (third SiC layer) 52 is formed on the first n type epitaxial layer 50 (FIG. 8). The second n type epitaxial layer 52 is formed by an epitaxial growth method. A film thickness of the second n type epitaxial layer 52 is, for example, equal to or greater than 0.1 μm and equal to or less than 1.0 μm.

Figure 9:
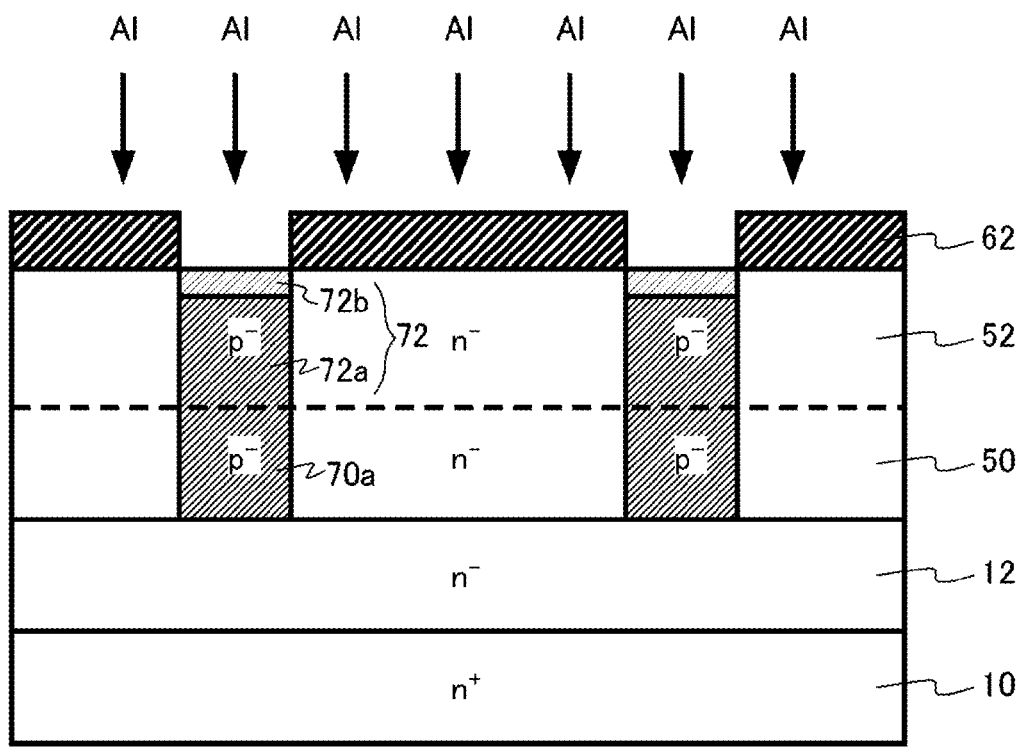

Next, aluminum (second impurity) is selectively ion-implanted into the second n type epitaxial layer 52 using a mask material 62 as a mask (FIG. 9). A p$^-$ type second p type region (second region) 72 is formed in the second n type epitaxial layer 52 by the ion implantation of aluminum. The second p type region 72 includes a high impurity concentration region 72a and a low impurity concentration region 72b. The second p type region 72 is formed on the first p type region 70.

The ion implantation of aluminum may be performed a plurality of times while changing acceleration energy so that the concentration of aluminum in the second p type region 72 becomes uniform in a film thickness direction.

Figure 10:
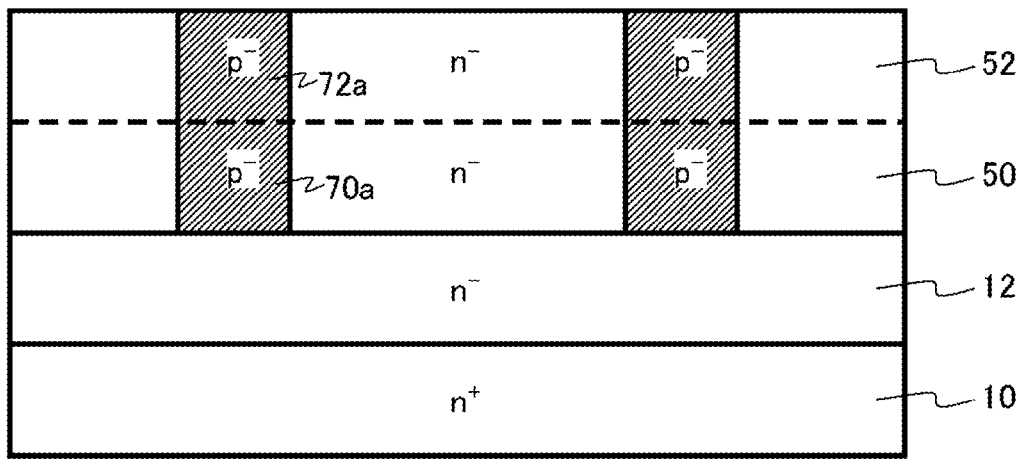

Next, the mask material 62 is peeled off. Next, the surface of the second n type epitaxial layer 52 is polished by the CMP, and the low impurity concentration region 72b which is a portion of the second p type region 72 is removed (FIG. 10).

Next, activation annealing for activating the ion-implanted aluminum is performed. The activation annealing is performed at a temperature of equal to or higher than 1,700° C. and equal to or lower than 1,900° C., for example, in a non-oxidizing atmosphere.

Next, an n$^-$ type third n type epitaxial layer 54 is formed on the second n type epitaxial layer 52. The third n type epitaxial layer 54 is formed by an epitaxial growth method. A film thickness of the third n type epitaxial layer 54 is, for example, equal to or greater than 0.1 μm and equal to or less than 1.0 μm.

Figure 11:
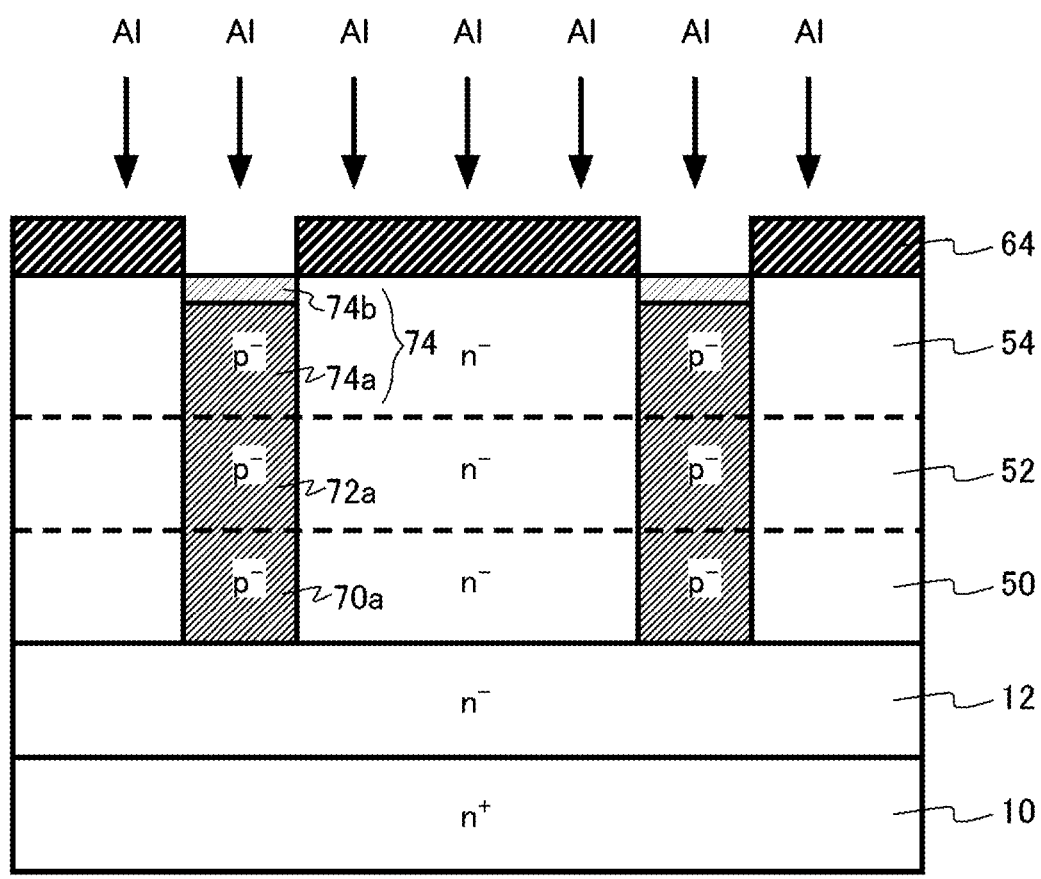

Next, aluminum is selectively ion-implanted into the third n type epitaxial layer 54 using a mask material 64 as a mask (FIG. 11). A p$^-$ type third p type region 74 is formed in the third n type epitaxial layer 54 by the ion implantation of aluminum. The third p type region 74 includes a high impurity concentration region 74a and a low impurity concentration region 74b. The third p type region 74 is formed on the second p type region 72.

The ion implantation of aluminum may be performed a plurality of times while changing acceleration energy so that the concentration of aluminum in the third p type region 74 becomes uniform in a film thickness direction.

Figure 12:
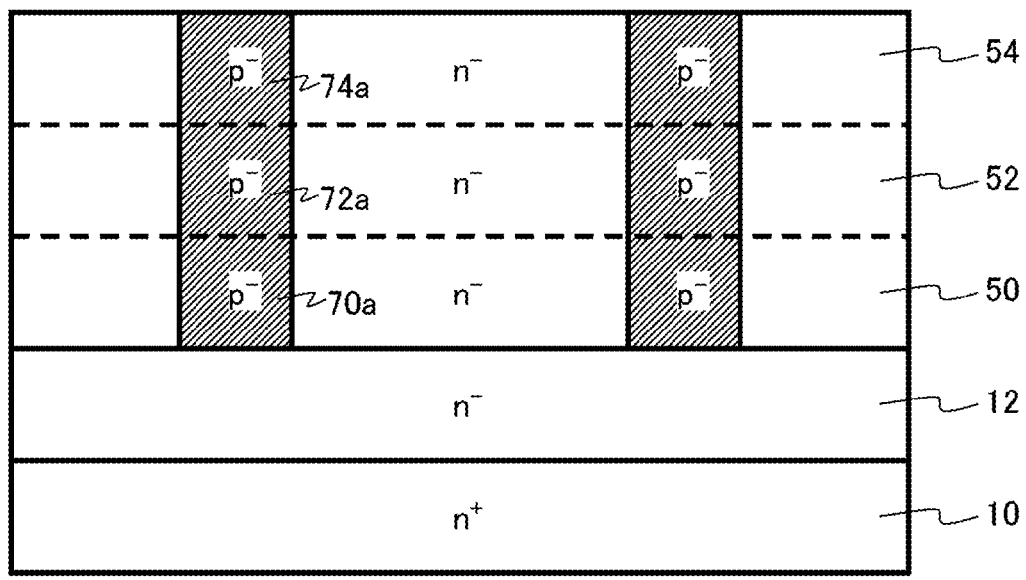

Next, the mask material 64 is peeled off. Next, the surface of the third n type epitaxial layer 54 is polished by the CMP, and the low impurity concentration region 74b which is a portion of the third p type region 74 is removed (FIG. 12).

Next, activation annealing for activating the ion-implanted aluminum is performed. The activation annealing is performed at a temperature of equal to or higher than 1,700° C. and equal to or lower than 1,900° C., for example, in a non-oxidizing atmosphere.

Figure 13:
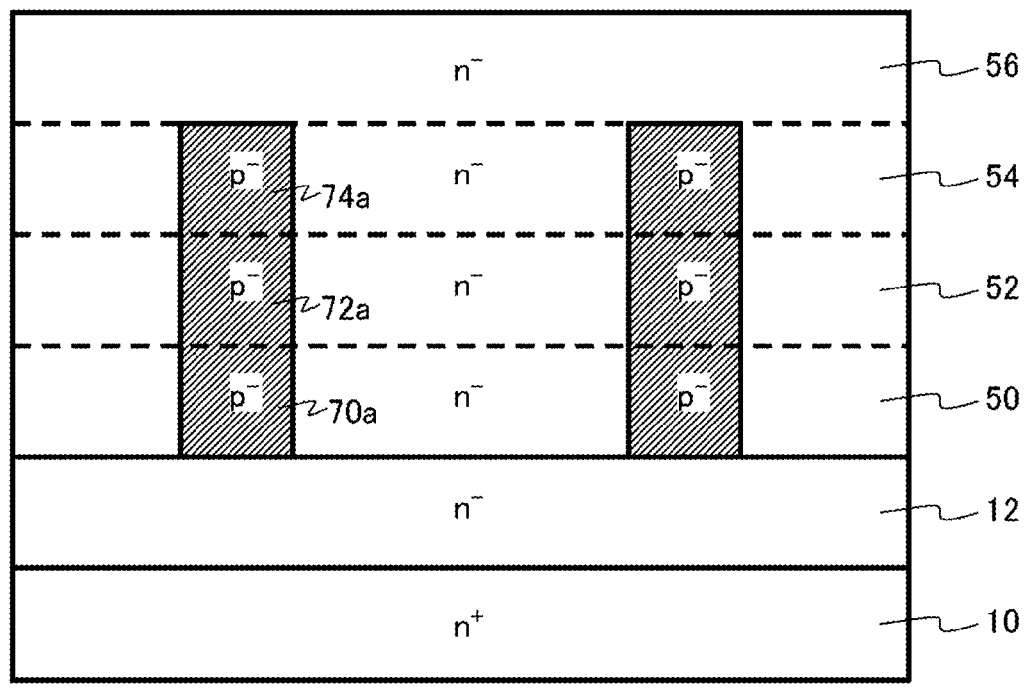

Next, an n$^-$ type surface layer 56 is formed on the third n type epitaxial layer 54 (FIG. 13). The surface layer 56 is formed by an epitaxial growth method. A film thickness of the surface layer 56 is, for example, equal to or greater than 0.1 μm and equal to or less than 1.0 μm.

Thereafter, the p type body region 18, the n$^+$ type source region 20, the p$^+$ type contact region 22, the gate insulating film 24, the gate electrode 26, the interlayer film 28, the source electrode 30, and the drain electrode 32 are formed by a conventional process. The MOSFET 100 illustrated in FIG. 1 is formed by the manufacturing method described above.

Figure 14:
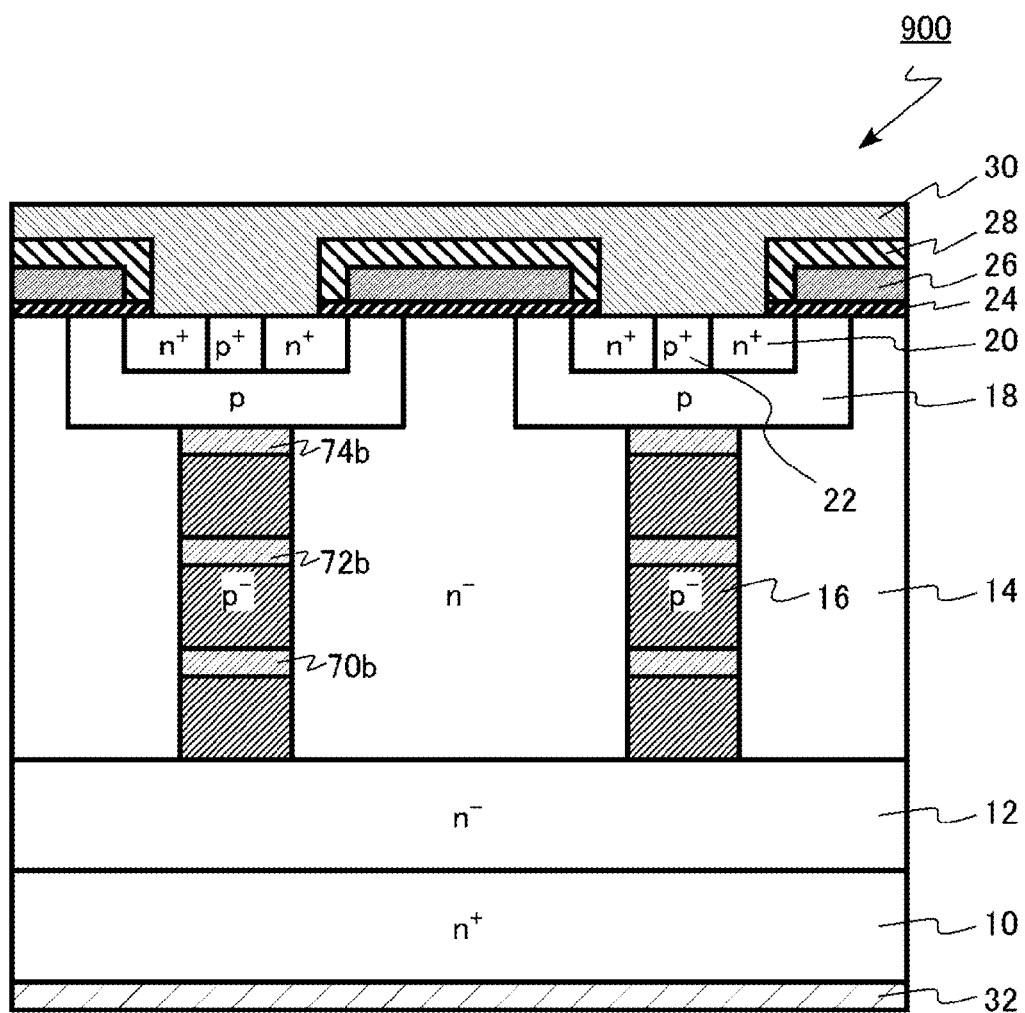
FIG. 14 is a schematic cross-sectional view of a semiconductor device manufactured by a method of manufacturing a semiconductor device, according to a comparative example.

Next, operations and effects of the method of manufacturing a semiconductor device according to the present embodiment will be described. FIG. 14 is a schematic cross-sectional view of a semiconductor device manufactured by a method of manufacturing a semiconductor device according to a comparative example. The semiconductor device according to the comparative example is a vertical MOSFET 900 that has a super junction structure using silicon carbide (SiC).

The method of manufacturing a semiconductor device according to the comparative example is different from the method of manufacturing a semiconductor device according to the present embodiment in that low impurity concentration regions 70b, 72b, and 74b are not removed. Therefore, in the MOSFET 900, the low impurity concentration regions 70b, 72b, and 74b are present in a p$^-$ type pillar region 16.

When the low impurity concentration regions 70b, 72b, and 74b are present in the p$^-$ type pillar region 16 of the MOSFET 900, a depletion layer extending to an n$^-$ type drift region 14 and the p$^-$ type pillar region 16 becomes non-uniform during a turn-off operation of the MOSFET 900. For this reason, a breakdown voltage of the MOSFET 900 becomes unstable, and thus there is a concern that the breakdown voltage might be reduced.

In the MOSFET 100 manufactured by the manufacturing method according to the present embodiment, the low impurity concentration regions 70b, 72b, and 74b are not present. In other words, the concentration of p type impurities in the p$^-$ type pillar region 16 becomes uniform. Therefore, a depletion layer extending to the n$^-$ type drift region 14 and the p$^-$ type pillar region 16 becomes uniform during a turn-off operation of the MOSFET 100. Accordingly, a breakdown voltage of the MOSFET 100 is stabilized, and thus a high breakdown voltage is realized.

In addition, in the manufacturing method according to the present embodiment, it is possible to flatten irregularities, such as step bunching, which are formed in the surface during the epitaxial growth of each of the first epitaxial layer 50, the second epitaxial layer 52, and the third epitaxial layer 54. Therefore, the crystallizability of an epitaxial growth layer which is formed subsequent to each of the layers is improved.

As described above, according to the present embodiment, the method of manufacturing a semiconductor device capable of realizing a high breakdown voltage is provided.

Second Embodiment

A method of manufacturing a semiconductor device according to the present embodiment is different from that in the first embodiment in that a portion of a first region is removed by the formation of a thermal oxide film on a first region and peeling-off of the thermal oxide film instead of being removed by CMP. A portion of a description overlapping with that in the first embodiment will be omitted.

FIGS. 15 to 23 are schematic cross-sectional views of a semiconductor device during manufacturing in the method of manufacturing a semiconductor device according to the present embodiment.

Figure 15:
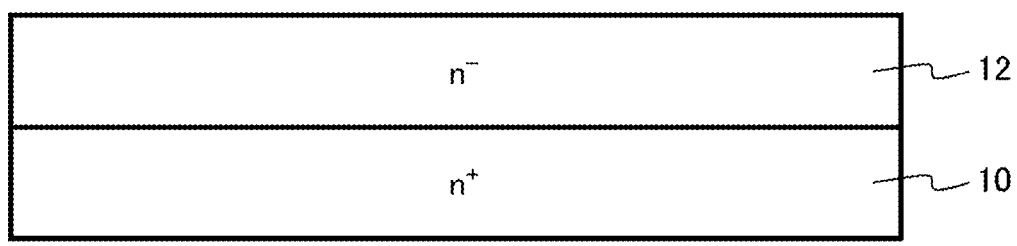
FIGS. 15-23 are each a schematic cross-sectional view of a semiconductor device during manufacturing according to a second embodiment.

First, an n$^+$ type SiC substrate 10 is prepared. Next, an n$^-$ type buffer layer (first SiC layer) 12 is formed on the SiC substrate 10 (FIG. 15).

Figure 16:
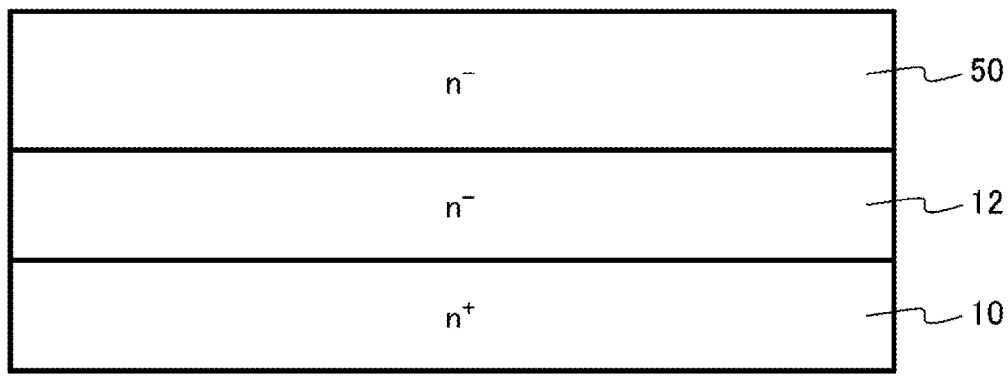

Next, an n$^-$ type first n type epitaxial layer (second SiC layer) 50 is formed on the buffer layer 12 (FIG. 16).

Next, a mask material 60 is formed on the first n type epitaxial layer 50. A mask material 60 is, for example, a silicon oxide film.

Figure 17:
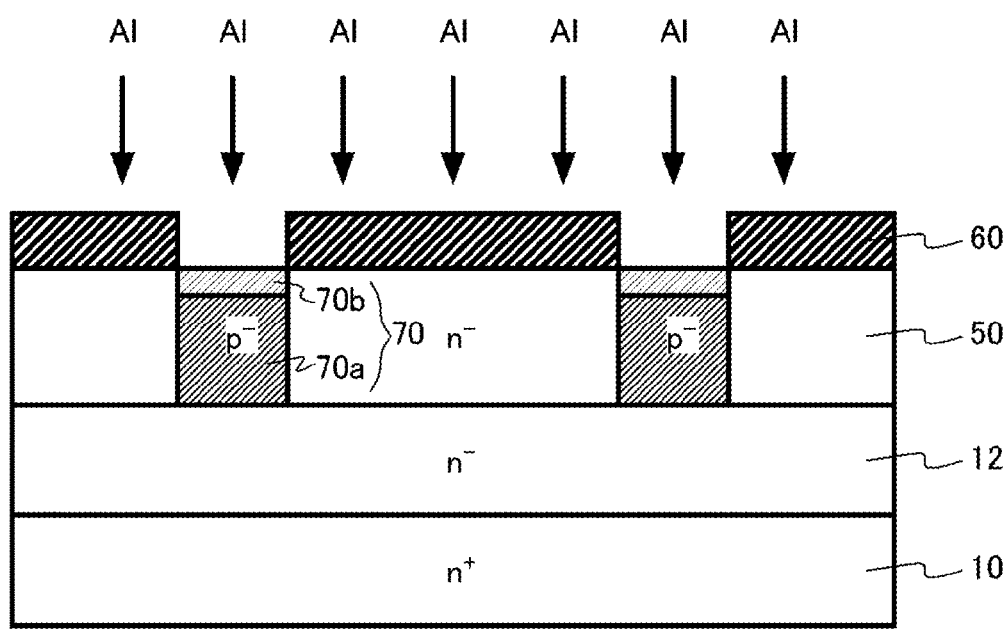

Next, aluminum (first impurity) is selectively ion-implanted into the first n type epitaxial layer 50 using the mask material 60 as a mask (FIG. 17). A p⁻ type first p type region (first region) 70 is formed in the first n type epitaxial layer 50 by the ion implantation of aluminum. The first p type region 70 includes a high impurity concentration region 70a and a low impurity concentration region 70b.

Figure 18:
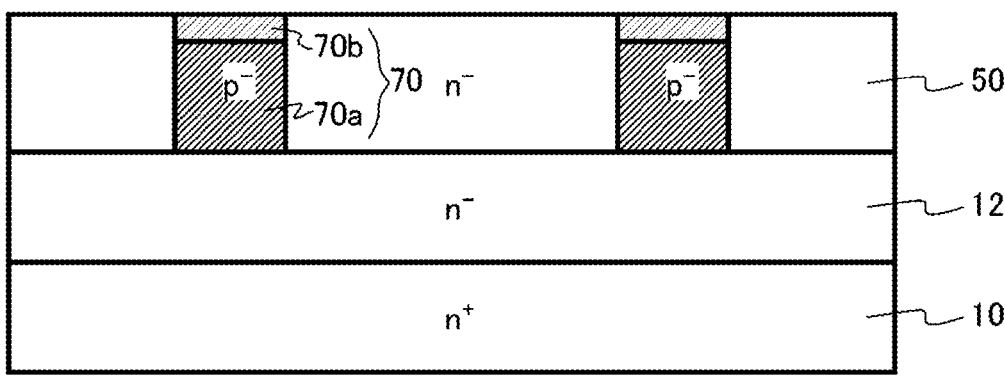

Next, the mask material 60 is peeled off (FIG. 18). Next, activation annealing for activating the ion-implanted aluminum is performed.

Figure 19:
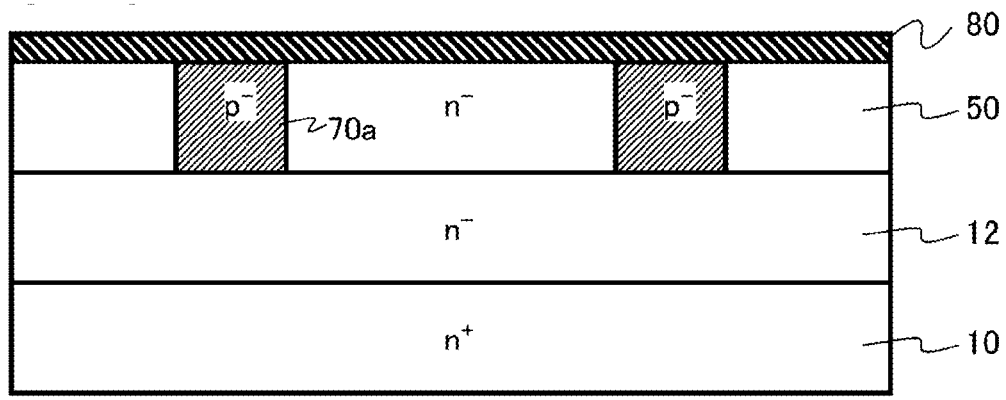

Next, a thermal oxide film 80 is formed on the surface of the first n type epitaxial layer 50 by thermal oxidation (FIG. 19). The low impurity concentration region 70b which is a portion of the first p type region 70 is oxidized by thermal oxidation.

Figure 20:
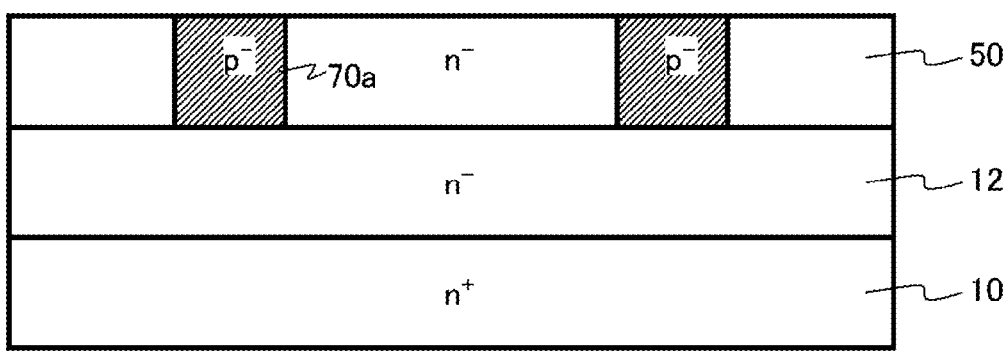

Next, the thermal oxide film 80 is peeled off. The thermal oxide film 80 is removed, for example, by wet etching using hydrofluoric acid as a liquid chemical. The low impurity concentration region 70b is removed by the peeling-off of the thermal oxide film 80 (FIG. 20).

When a portion of the first p type region 70 is removed by the formation of the thermal oxide film 80 and the peeling-off of the thermal oxide film 80, it is preferable to remove a region in which a peak concentration position of aluminum is present in the portion of the first p type region 70. A thickness of the portion of the first p type region 70 which is removed is, for example, equal to or greater than 0.05 μm and equal to or less than 0.2 μm.

Figure 21:
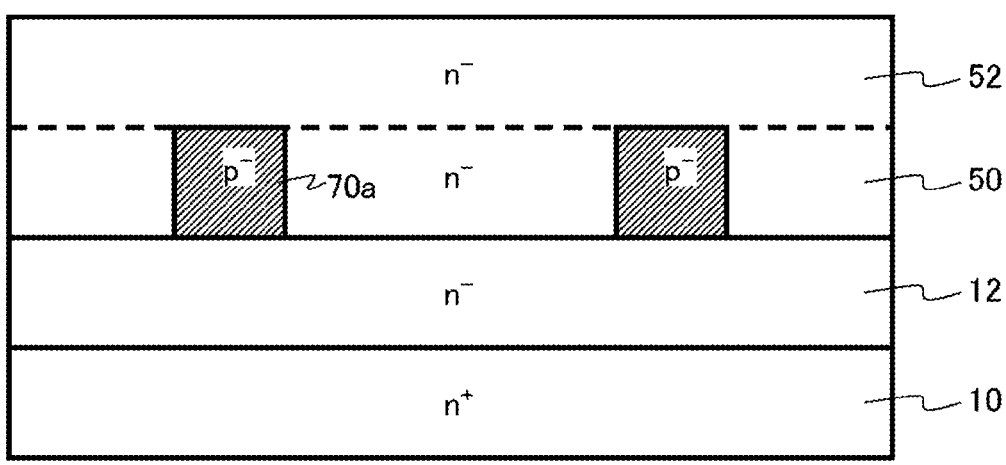

Next, an n⁻ type second n type epitaxial layer (third SiC layer) 52 is formed on the first n type epitaxial layer 50 (FIG. 21).

Figure 22:
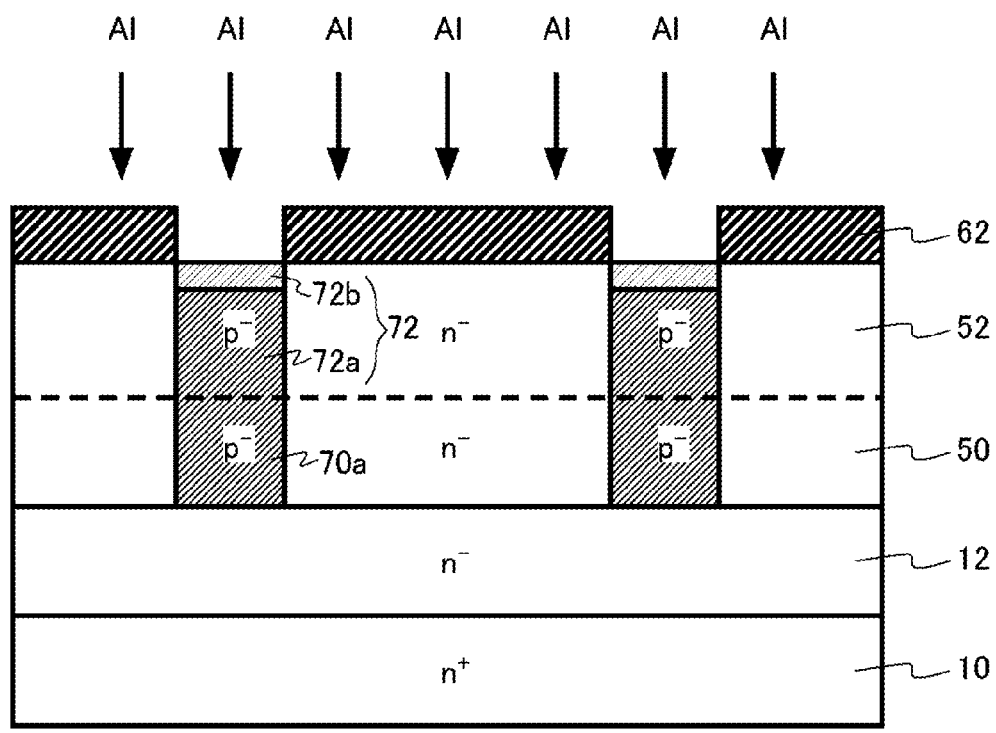

Next, aluminum (second impurity) is selectively ion-implanted into the second n type epitaxial layer 52 using a mask material 62 as a mask (FIG. 22). A p⁻ type second p type region (second region) 72 is formed in the second n type epitaxial layer 52 by the ion implantation of aluminum. The second p type region 72 includes a high impurity concentration region 72a and a low impurity concentration region 72b.

Next, the mask material 62 is peeled off. Next, activation annealing for activating the ion-implanted aluminum is performed.

Next, a thermal oxide film is formed on the surface of the second n type epitaxial layer 52 by thermal oxidation. The low impurity concentration region 72b which is a portion of the second p type region 72 is oxidized by thermal oxidation.

Next, the thermal oxide film is peeled off. The low impurity concentration region 72b is removed by the peeling-off of the thermal oxide film.

Next, an n⁻ type third n type epitaxial layer 54 is formed on the second n type epitaxial layer 52.

Next, aluminum is selectively ion-implanted into the third n type epitaxial layer 54 using a mask material as a mask.

Next, a thermal oxide film is formed on the surface of the third n type epitaxial layer 54 by thermal oxidation. Next, the thermal oxide film is peeled off.

Figure 23:
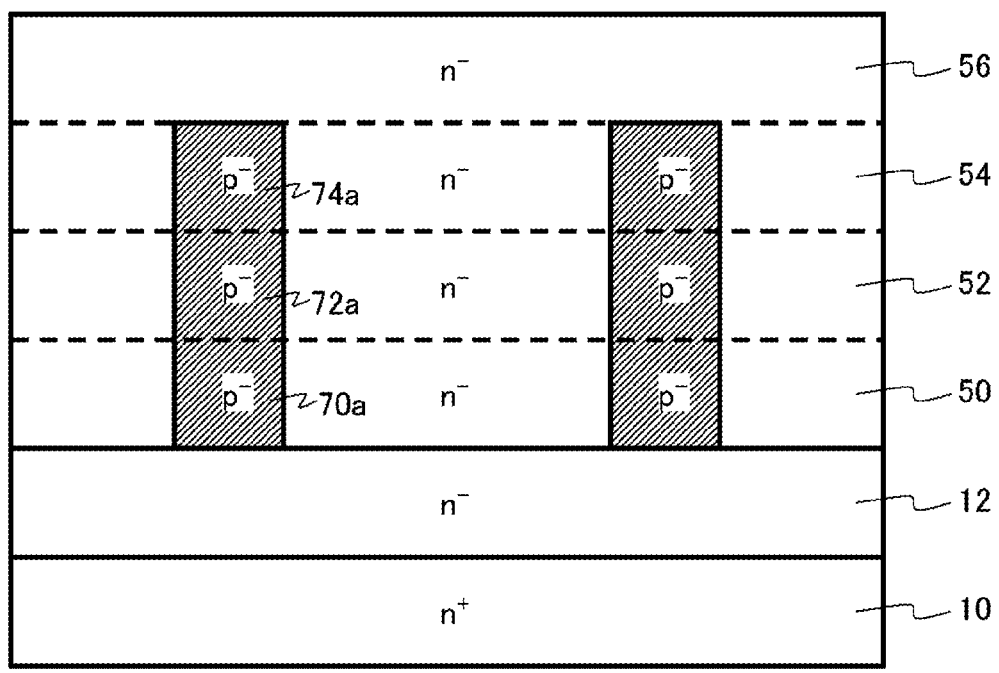

Next, an n⁻ type surface layer 56 is formed on the third n type epitaxial layer 54 (FIG. 23).

Thereafter, a p type body region 18, an n⁺ type source region 20, a p⁺ type contact region 22, a gate insulating film 24, a gate electrode 26, an interlayer film 28, a source electrode 30, and a drain electrode 32 are formed by a conventional process. The MOSFET 100 illustrated in FIG. 1 is formed by the manufacturing method described above.

According to the present embodiment, the method of manufacturing a semiconductor device capable of realizing a high breakdown voltage is provided as in the first embodiment.

Third Embodiment

A method of manufacturing a semiconductor device according to the present embodiment is different from that in the first embodiment in that a portion of a first region is removed by dry etching instead of being removed by the CMP. A portion of the description overlapping with that in the first embodiment will be omitted.

In the present embodiment, a low impurity concentration region 70b, a low impurity concentration region 72b, and a low impurity concentration region 74b are removed by dry etching. The dry etching is, for example, reactive ion etching (RIE). According to the present embodiment, the method of manufacturing a semiconductor device capable of realizing a high breakdown voltage is provided as in the first embodiment.

Fourth Embodiment

In a method of manufacturing a semiconductor device according to the present embodiment, a second SiC layer of a first conductivity type is formed on a first SiC layer by epitaxial growth, first impurities of a second conductivity type are selectively ion-implanted into the second SiC layer to form a first region of the second conductivity type, a third SiC layer of the first conductivity type is formed on the second SiC layer by epitaxial growth, and second impurities of the second conductivity type are selectively ion-implanted into the third SiC layer to form a second region of the second conductivity type on the first region, and a peak concentration position of the second impurities is formed in the first region.

FIGS. 24 to 32 are schematic cross-sectional views of a semiconductor device during manufacturing in the method of manufacturing a semiconductor device according to the present embodiment.

First, an n⁺ type SiC substrate 10 is prepared. The SiC substrate 10 is, for example, a 4H—SiC single crystal substrate. For example, the surface of the SiC substrate 10 is a surface which is inclined at equal to or greater than 0 degrees and equal to or less than 8 degrees with respect to a (0001) surface.

Figure 24:
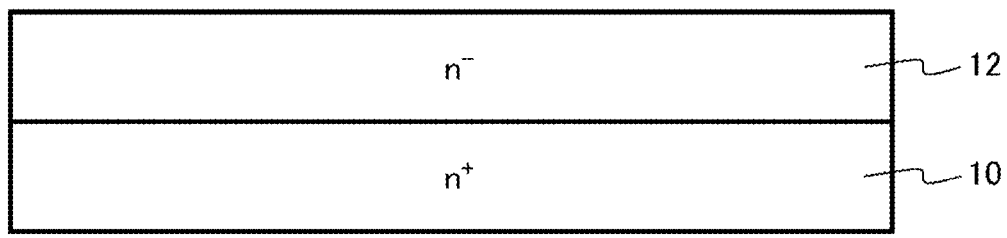
FIGS. 24-32 are each a schematic cross-sectional view of a semiconductor device during manufacturing according to a fourth embodiment.

Next, an n⁻ type buffer layer (first SiC layer) 12 is formed on the SiC substrate 10 (FIG. 24). The buffer layer 12 is formed by an epitaxial growth method. A film thickness of the buffer layer 12 is, for example, equal to or greater than 0.1 μm and equal to or less than 1.0 μm.

Figure 25:
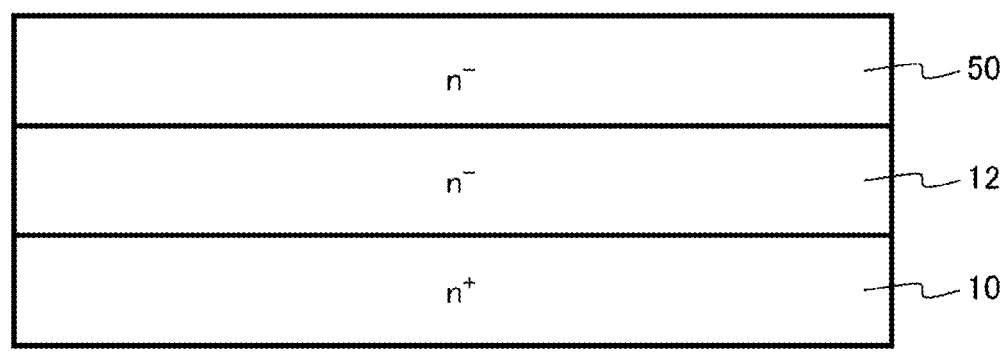

Next, an n⁻ type first n type epitaxial layer (second SiC layer) 50 is formed on the buffer layer 12 (FIG. 25). The first n type epitaxial layer 50 is formed by an epitaxial growth method. A film thickness of the first n type epitaxial layer 50 is, for example, equal to or greater than 0.1 μm and equal to or less than 1.0 μm.

Next, a mask material 60 is formed on the first n type epitaxial layer 50. The mask material 60 is, for example, a silicon oxide film.

Figure 26:
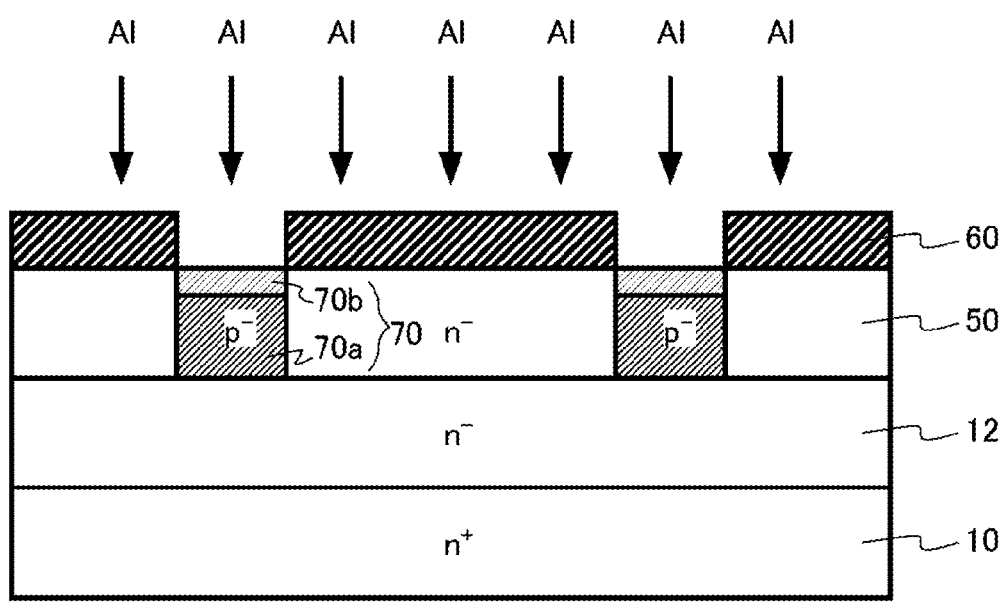

Next, aluminum (first impurity) is selectively ion-implanted into the first n type epitaxial layer 50 using the mask material 60 as a mask (FIG. 26). A p⁻ type first p type region (first region) 70 is formed in the first n type epitaxial layer 50 by the ion implantation of aluminum. The first p type region 70 includes a high impurity concentration region 70a and a low impurity concentration region 70b.

The ion implantation of aluminum may be performed a plurality of times while changing acceleration energy so that the concentration of aluminum in the first p type region 70 becomes uniform in a film thickness direction.

Figure 27:
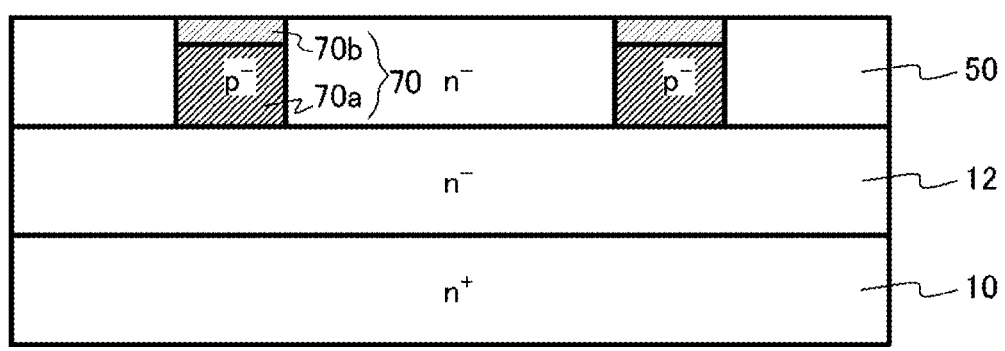

Next, the mask material 60 is peeled off (FIG. 27). The peeling-off of the mask material is performed by, for example, wet etching.

Next, activation annealing for activating the ion-implanted aluminum is performed. The activation annealing is performed at a temperature of equal to or higher than 1,700° C. and equal to or lower than 1,900° C., for example, in a non-oxidizing atmosphere.

Figure 28:
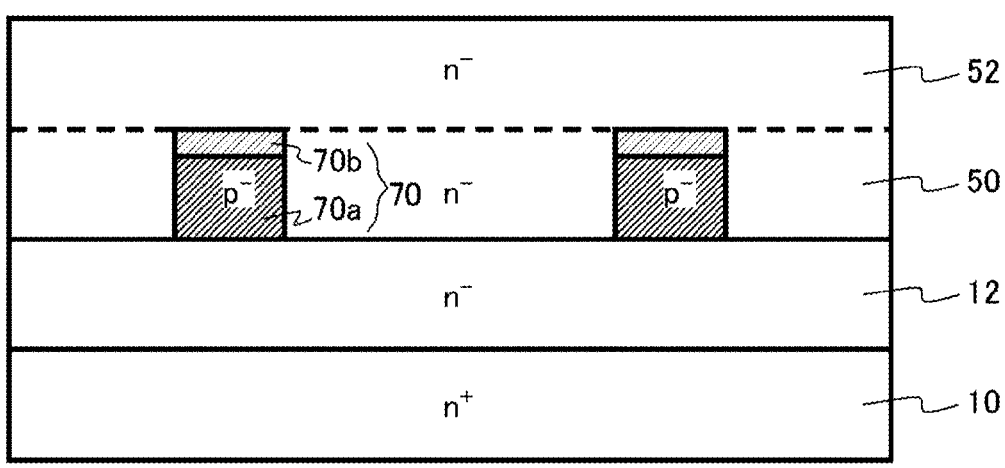

Next, an n⁻ type second n type epitaxial layer (third SiC layer) 52 is formed on the first n type epitaxial layer 50 (FIG. 28). The second n type epitaxial layer 52 is formed by an epitaxial growth method. A film thickness of the second n type epitaxial layer 52 is, for example, equal to or greater than 0.1 μm and equal to or less than 1.0 μm.

Figure 29:
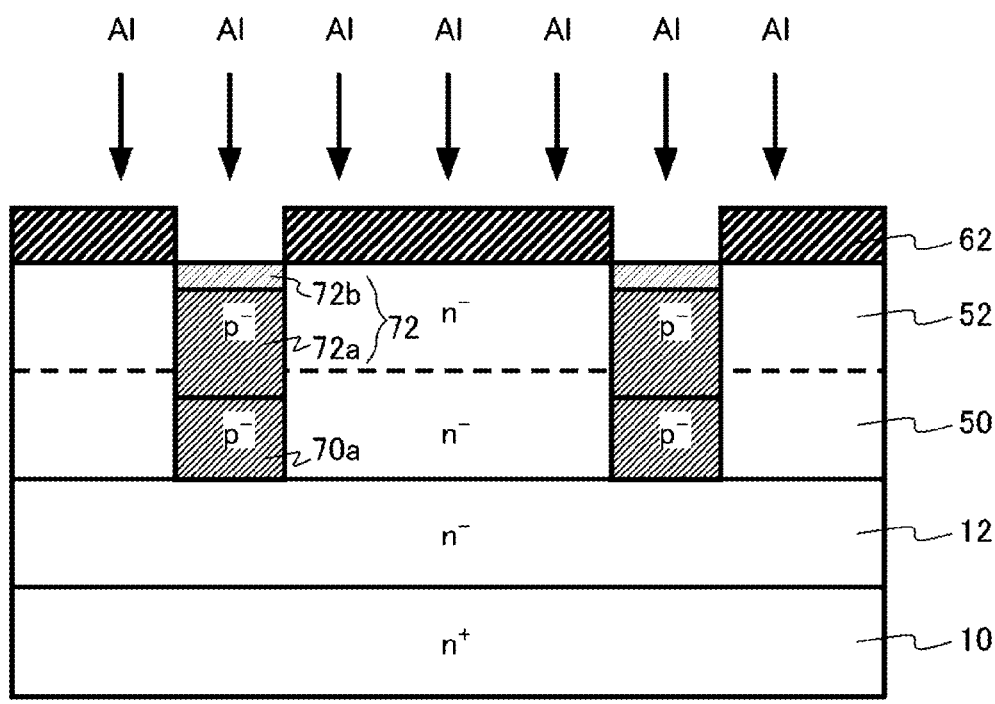

Next, aluminum (second impurity) is selectively ion-implanted into the second n type epitaxial layer 52 using a mask material 62 as a mask (FIG. 29). A p⁻ type second p type region (second region) 72 is formed in the second n type epitaxial layer 52 by the ion implantation of aluminum. The second p type region 72 includes a high impurity concentration region 72a and a low impurity concentration region 72b.

The second p type region 72 is formed on the first p type region 70. A peak concentration position of aluminum (second impurity) which is ion-implanted into the first p type region 70 is provided. The peak concentration position of aluminum is adjusted by adjusting acceleration energy during the ion implantation of aluminum. For example, acceleration energy is set so that a projected range (Rp) of aluminum becomes deeper than the film thickness of the second n type epitaxial layer 52. The concentration of aluminum in the low impurity concentration region 70b of the first p type region 70 increases, and thus, for example, the low impurity concentration region 70b disappears.

The ion implantation of aluminum may be performed a plurality of times while changing acceleration energy so that the concentration of aluminum in the second p type region 72 becomes uniform in the film thickness direction. When the ion implantation is performed a plurality of times, a peak position of aluminum, for example, formed by the ion implantation with the highest acceleration energy is located in the first p type region 70.

Figure 30:
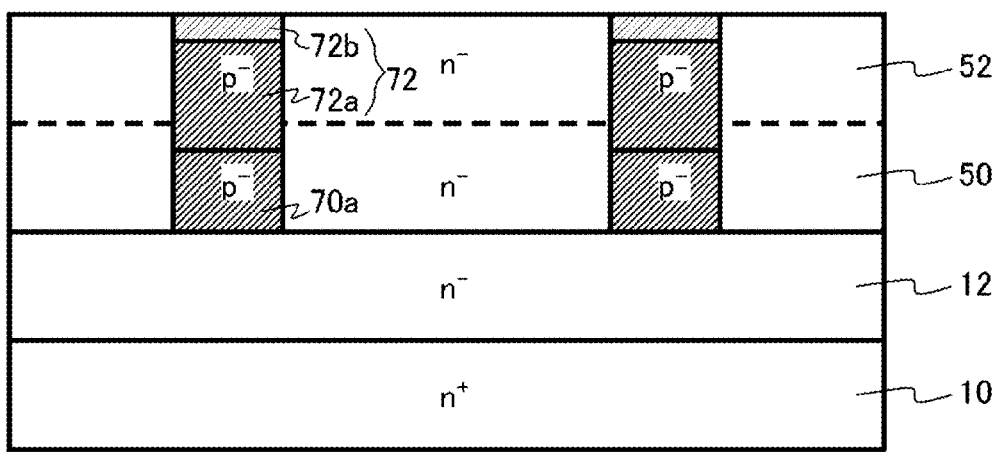

Next, the mask material 62 is peeled off (FIG. 30).

Next, activation annealing for activating the ion-implanted aluminum is performed. The activation annealing is performed at a temperature of equal to or higher than 1,700° C. and equal to or lower than 1,900° C., for example, in a non-oxidizing atmosphere.

Figure 31:
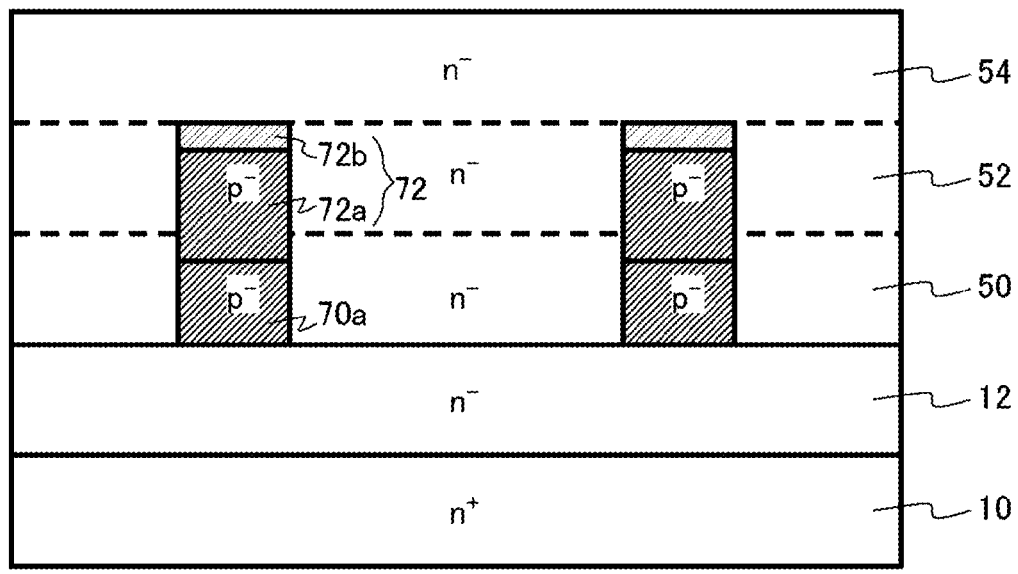

Next, an n⁻ type third n type epitaxial layer 54 is formed on the second n type epitaxial layer 52 (FIG. 31). The third n type epitaxial layer 54 is formed by an epitaxial growth method. A film thickness of the third n type epitaxial layer 54 is, for example, equal to or greater than 0.1 μm and equal to or less than 1.0 μm.

Figure 32:
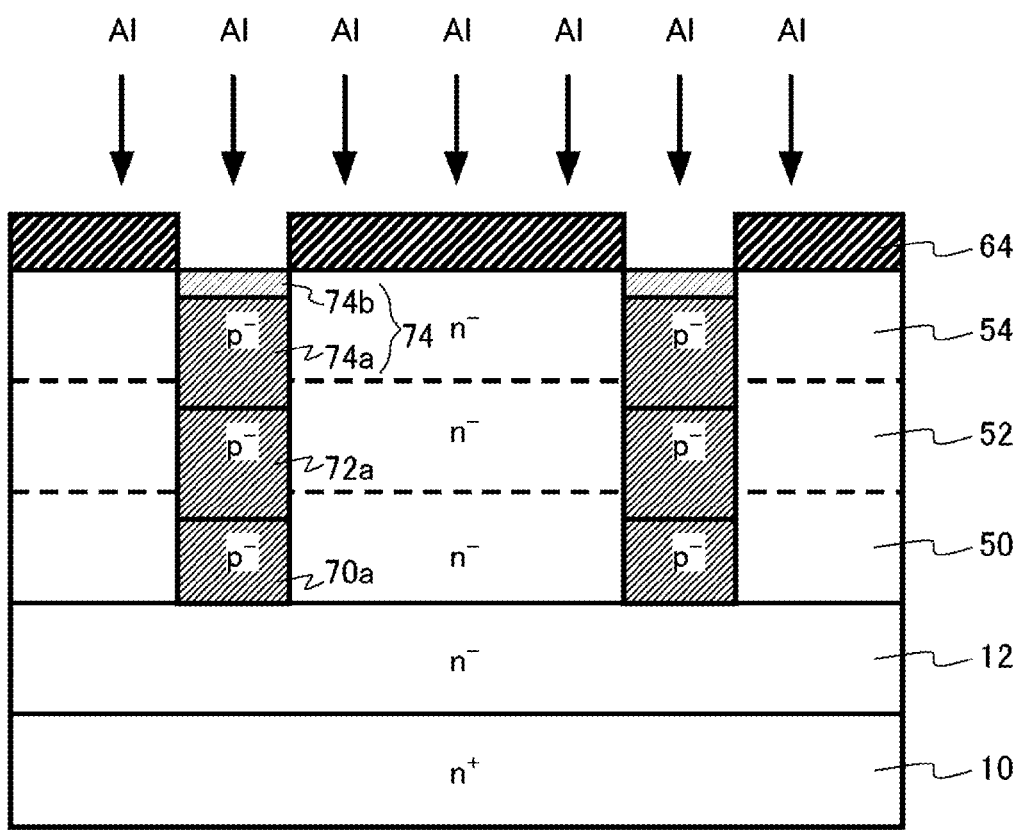

Next, aluminum is selectively ion-implanted into the third n type epitaxial layer 54 using a mask material 64 as a mask (FIG. 32). A p⁻ type third p type region 74 is formed in the third n type epitaxial layer 54 by the ion implantation of aluminum. The third p type region 74 includes a high impurity concentration region 74a and a low impurity concentration region 74b.

The third p type region 74 is formed on the second p type region 72. A peak concentration position of aluminum ion-implanted into the second p type region 72 is provided. The peak concentration position of aluminum is adjusted by adjusting acceleration energy during the ion implantation of aluminum. For example, acceleration energy is set so that a projected range (Rp) of aluminum becomes deeper than the film thickness of the third n type epitaxial layer 54. The concentration of aluminum in the low impurity concentration region 72b of the second p type region 72 increases, and thus, for example, the low impurity concentration region 72b disappears.

The ion implantation of aluminum may be performed a plurality of times while changing acceleration energy so that the concentration of aluminum in the third p type region 74 becomes uniform in the film thickness direction. When the ion implantation is performed a plurality of times, a peak position of aluminum, for example, formed by the ion implantation with the highest acceleration energy is located in the second p type region 72.

Next, the mask material 64 is peeled off. Next, an n⁻ type surface layer 56 is formed on the third n type epitaxial layer 54 (not shown). The surface layer 56 is formed by an epitaxial growth method. A film thickness of the surface layer 56 is, for example, equal to or greater than 0.1 μm and equal to or less than 1.0 μm.

Next, activation annealing for activating the ion-implanted aluminum is performed. The activation annealing is performed at a temperature of equal to or higher than 1,700° C. and equal to or lower than 1,900° C., for example, in a non-oxidizing atmosphere.

Thereafter, a p type body region 18, an n⁺ type source region 20, a p⁺ type contact region 22, a gate insulating film 24, a gate electrode 26, an interlayer film 28, a source electrode 30, and a drain electrode 32 are formed by a conventional process. For example, when the p type body region is formed by ion implantation, the low impurity concentration region 74b becomes part of the p type body region 18. The MOSFET 100 illustrated in FIG. 1 is formed by the manufacturing method described above.

In the manufacturing method according to the present embodiment, aluminum is also implanted into a p type region in a lower epitaxial layer during the ion implantation of aluminum when forming a p type region in an upper epitaxial layer. Therefore, the concentration of aluminum of a low impurity concentration region in the lower epitaxial layer is supplemented, and thus the concentration of aluminum increases.

In the MOSFET 100 manufactured by the manufacturing method according to the present embodiment, low impurity concentration regions 70b, 72b, and 74b are not present. In other words, the concentration of p type impurities in a p⁻ type pillar region 16 becomes uniform. Therefore, a depletion layer extending to an n⁻ type drift region 14 and the p⁻ type pillar region 16 becomes uniform during a turn-off operation of the MOSFET 100. Accordingly, a breakdown voltage of the MOSFET 100 is stabilized, and thus a high breakdown voltage is realized.

As described above, according to the present embodiment, the method of manufacturing a semiconductor device capable of realizing a high breakdown voltage is provided.

Fifth Embodiment

A method of manufacturing a semiconductor device according to the present embodiment is different from that in the second embodiment in that a portion of a first region is selectively removed when a portion of the first region is removed and a groove is formed in the surface of a second SiC layer. Hereinafter, the description overlapping with that in the second embodiment will be omitted.

Figure 33:
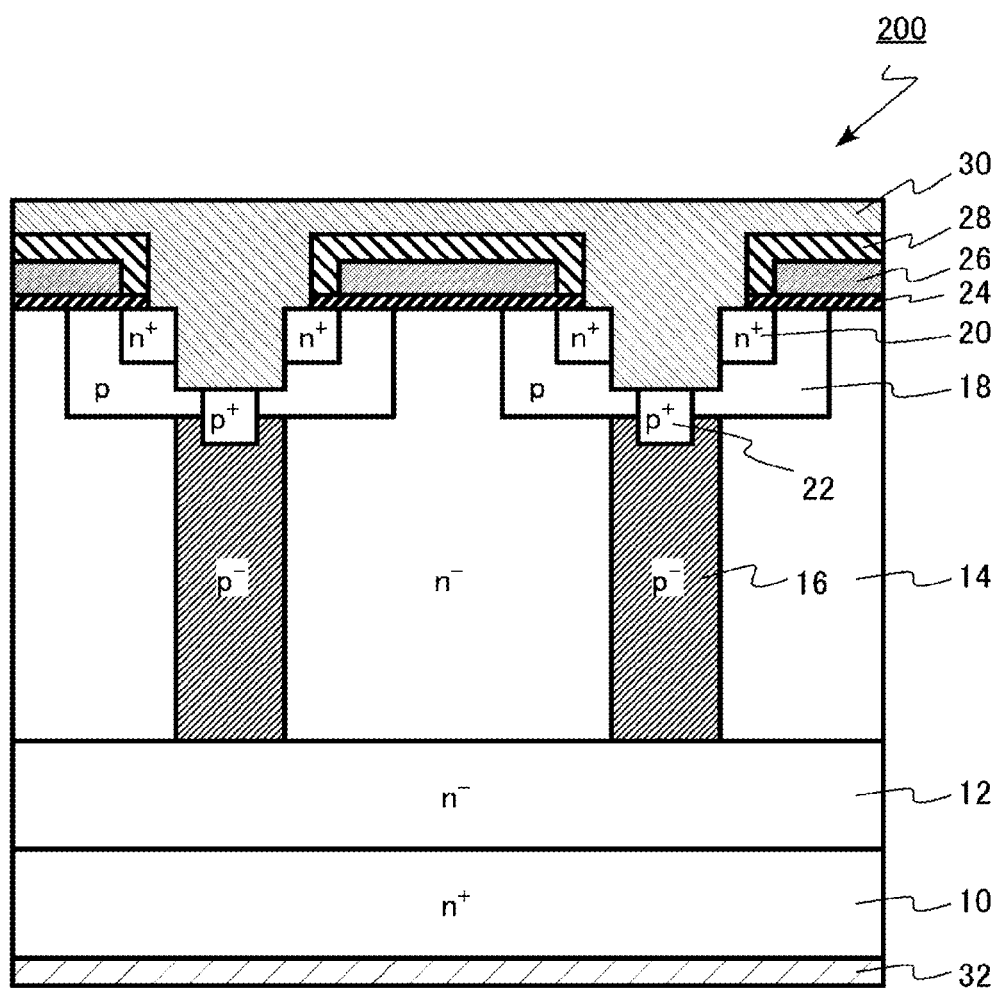
FIG. 33 is a schematic cross-sectional view of a semiconductor device manufactured by a method of manufacturing a semiconductor device according to a fifth embodiment.

FIG. 33 is a schematic cross-sectional view of a semiconductor device manufactured by a method of manufacturing a semiconductor device according to the present embodiment. The semiconductor device according to the present embodiment is a vertical MOSFET 200 that has a super junction structure using silicon carbide (SiC). In the description hereinafter, an example will be given in which a first conductivity type is an n type and a second conductivity type is a p type.

The MOSFET 200 includes an n$^+$ type SiC substrate 10, an n$^-$ type buffer layer 12, an n$^-$ type drift region 14, a p$^-$ type pillar region 16, a p type body region 18, an n$^+$ type source region 20, a p$^+$ type contact region 22, a gate insulating film 24, a gate electrode 26, an interlayer film 28, a source electrode 30, and a drain electrode 32. The MOSFET 200 is a trench contact type MOSFET in which a source electrode 30 is formed within a trench.

FIGS. 34 to 44 are schematic cross-sectional views of a semiconductor device during manufacturing in the method of manufacturing a semiconductor device according to the present embodiment.

Figure 34:
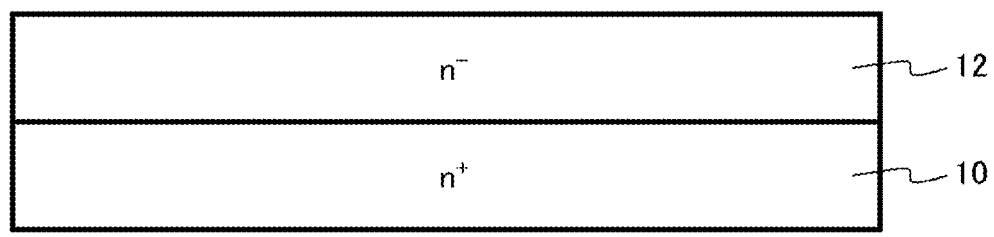
FIGS. 34-44 are each a schematic cross-sectional view of the semiconductor device during manufacturing according to the fifth embodiment.

First, the n$^+$ type SiC substrate 10 is prepared. Next, the n$^-$ type buffer layer (first SiC layer) 12 is formed on the SiC substrate 10 (FIG. 34).

Next, an n$^-$ type first n type epitaxial layer (second SiC layer) 50 is formed on the buffer layer 12. Next, a mask material 60 is formed on the first n type epitaxial layer 50. The mask material 60 is, for example, a silicon oxide film.

Figure 35:
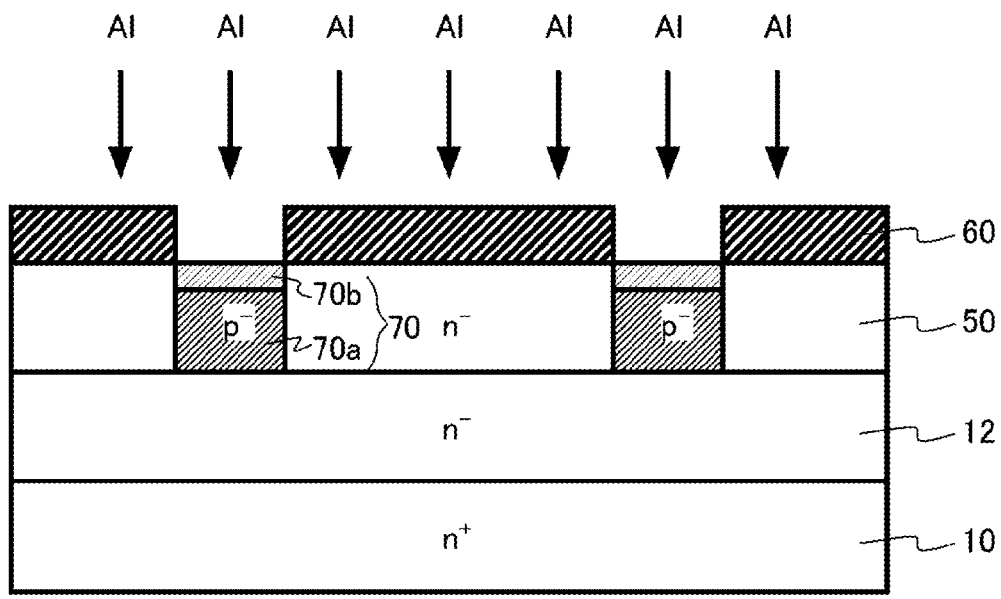

Next, aluminum (first impurity) is selectively ion-implanted into the first n type epitaxial layer 50 using the mask material 60 as a mask (FIG. 35). A p$^-$ type first p type region (first region) 70 is formed in the first n type epitaxial layer 50 by the ion implantation of aluminum. The first p type region 70 includes a high impurity concentration region 70a and a low impurity concentration region 70b.

Figure 36:
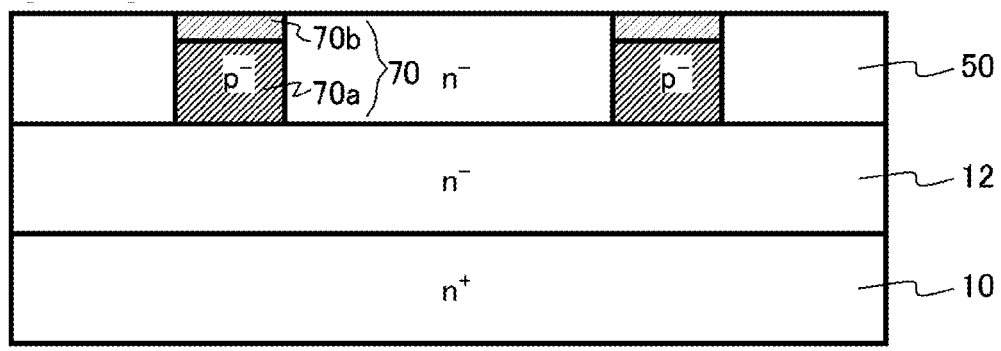

Next, the mask material 60 is peeled off (FIG. 36). Next, activation annealing for activating the ion-implanted aluminum is performed.

Figure 37:
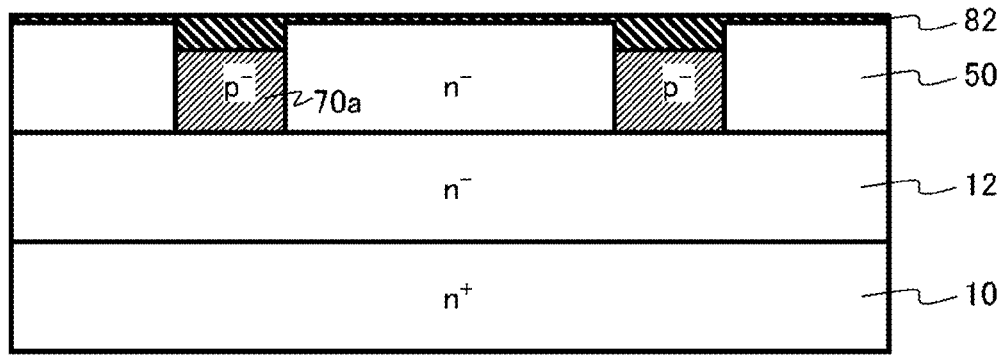

Next, a thermal oxide film 82 is formed on the surface of the first n type epitaxial layer 50 by thermal oxidation (FIG. 37). The low impurity concentration region 70b which is a portion of the first p type region 70 is oxidized by thermal oxidation so as to have a thickness larger than that of the first n type epitaxial layer 50. The oxidation is performed under an oxidation condition in which an oxidation rate of the low impurity concentration region 70b containing aluminum becomes higher than that of the first n type epitaxial layer 50 that does not contain aluminum.

Figure 38:
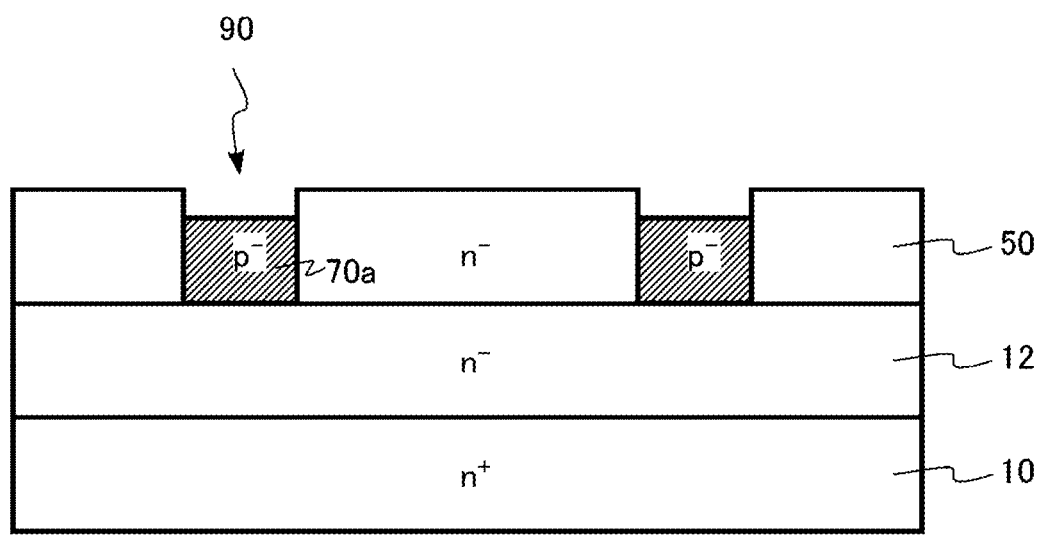

Next, the thermal oxide film 82 is peeled off. The thermal oxide film 82 is removed, for example, by wet etching using hydrofluoric acid as a liquid chemical. The low impurity concentration region 70b is removed by the peeling-off of the thermal oxide film 82 (FIG. 38). At this time, a groove 90 is formed on the first p type region 70. The groove 90 is formed in the surface of the first n type epitaxial layer 50.

When a portion of the first p type region 70 is removed by the formation and peeling-off of the thermal oxide film 82, it is preferable to remove a region in which a peak concentration position of aluminum is present in the first p type region 70. A thickness of the first p type region 70 which is removed is, for example, equal to or greater than 0.05 μm and equal to or less than 0.2 μm.

Figure 39:
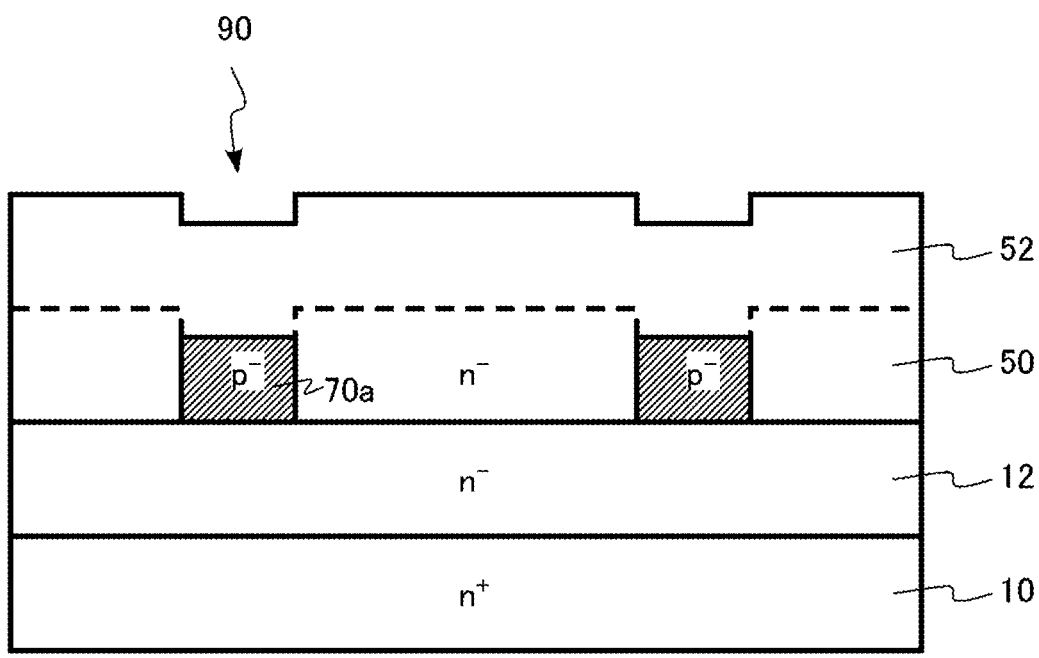

Next, an n$^-$ type second n type epitaxial layer (third SiC layer) 52 is formed on the first n type epitaxial layer 50 (FIG. 39). The groove 90 is transferred onto the surface of the second n type epitaxial layer 52.

Figure 40:
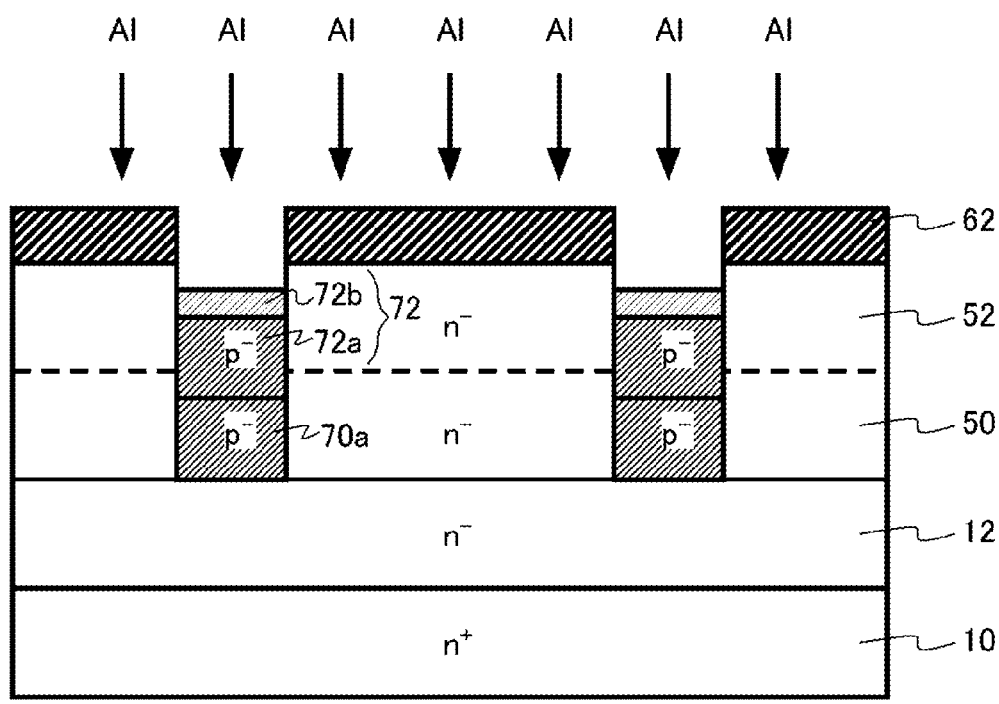

Next, aluminum (second impurity) is selectively ion-implanted into the second n type epitaxial layer 52 using a mask material 62 as a mask (FIG. 40). A p$^-$ type second p type region (second region) 72 is formed in the second n type epitaxial layer 52 by the ion implantation of aluminum. The second p type region 72 includes a high impurity concentration region 72a and a low impurity concentration region 72b.

Next, the mask material 62 is peeled off. Next, activation annealing for activating the ion-implanted aluminum is performed.

Figure 41:
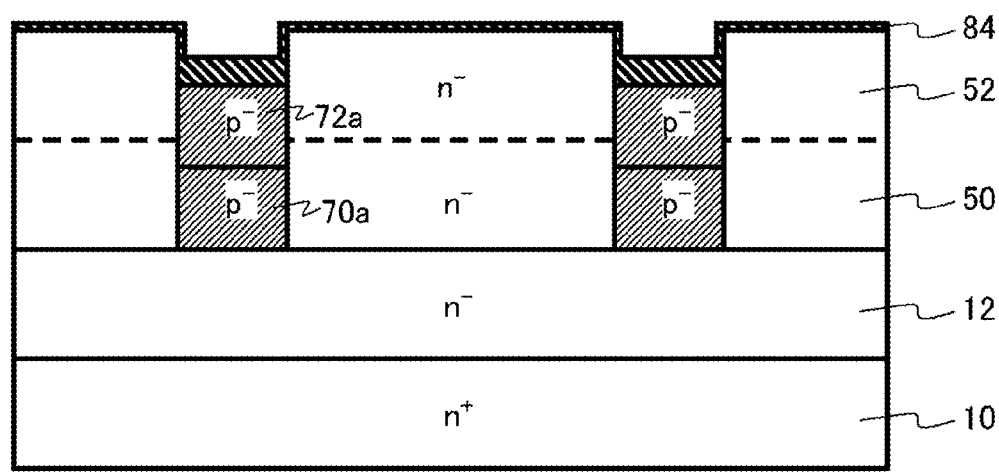

Next, a thermal oxide film 84 is formed on the surface of the second n type epitaxial layer 52 by thermal oxidation (FIG. 41). The low impurity concentration region 72b which is a portion of the second p type region 72 is oxidized by thermal oxidation so as to have a thickness larger than that of the second n type epitaxial layer 52. The oxidation is performed under an oxidation condition in which an oxidation rate of the low impurity concentration region 72b containing aluminum becomes higher than that of the second n type epitaxial layer 52 that does not contain aluminum.

Figure 42:
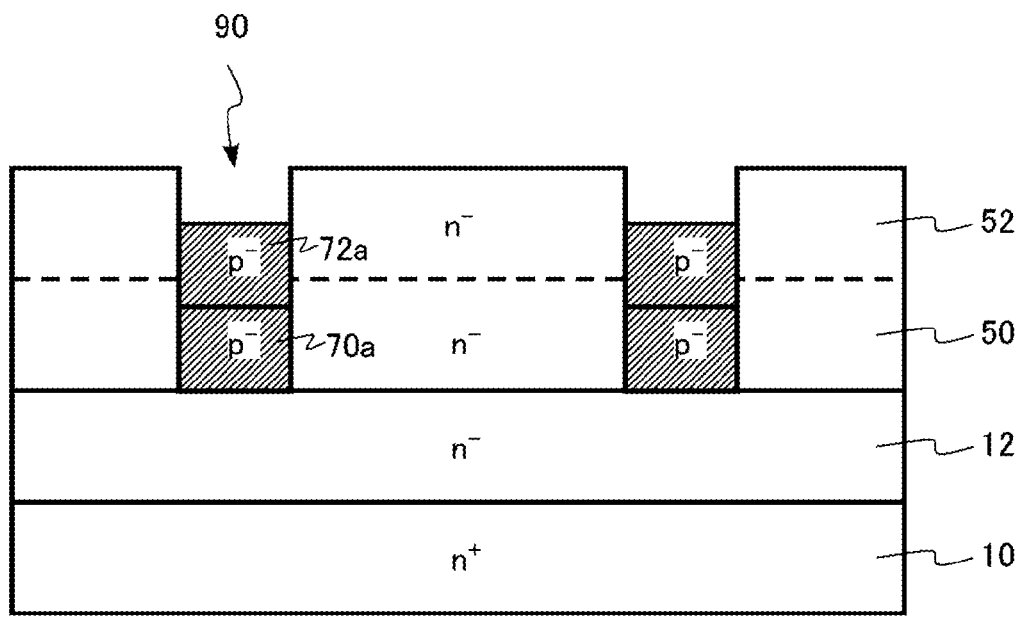

Next, the thermal oxide film 84 is peeled off. The thermal oxide film 84 is removed, for example, by wet etching using hydrofluoric acid as a liquid chemical. The low impurity concentration region 72b is removed by the peeling-off of the thermal oxide film 84 (FIG. 42). At this time, the groove 90 on the second p type region 72 becomes deeper.

When a portion of the second p type region 72 is removed by the formation and peeling-off of the thermal oxide film 84, it is preferable to remove a region in which a peak concentration position of aluminum is present in the portion of the second p type region 72. A thickness of the portion of the second p type region 72 which is removed is, for example, equal to or greater than 0.05 μm and equal to or less than 0.2 μm.

Figure 43:
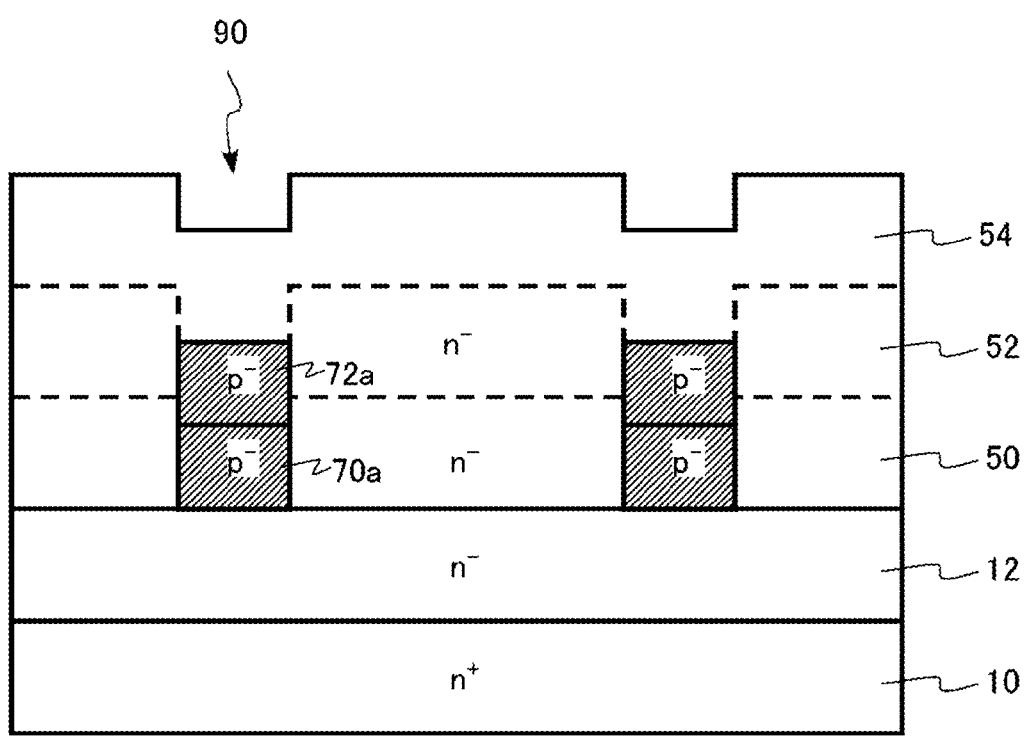

Next, an n$^-$ type third n type epitaxial layer 54 is formed on the second n type epitaxial layer 52 (FIG. 43). The groove 90 is transferred onto the surface of the third n type epitaxial layer 54.

Next, aluminum is selectively ion-implanted into the third n type epitaxial layer 54 using a mask material as a mask. A p$^-$ type third p type region is formed in the third n type epitaxial layer 54 by the ion implantation of aluminum. The third p type region includes a high impurity concentration region 74a and a low impurity concentration region 74b.

Next, the mask material is peeled off. Next, activation annealing for activating the ion-implanted aluminum is performed.

Next, a thermal oxide film is formed on the surface of the third n type epitaxial layer 54 by thermal oxidation. The low impurity concentration region which is a portion of the third p type region is oxidized by thermal oxidation so as to have a thickness larger than that of the third n type epitaxial layer 54.

Next, the thermal oxide film is peeled off. The low impurity concentration region is removed, for example, by the peeling-off of the thermal oxide film. At this time, the groove 90 on the third p type region becomes deeper.

Next, an n$^-$ type surface layer 56 is formed on the third n type epitaxial layer 54. The groove 90 is transferred onto the surface of the surface layer 56.

Next, aluminum is selectively ion-implanted into the surface layer 56 using a mask material as a mask. A p$^-$ type fourth p type region 76 is formed in the surface layer 56 by the ion implantation of aluminum. The fourth p type region 76 includes a high impurity concentration region 76a and a low impurity concentration region 76b.

Figure 44:
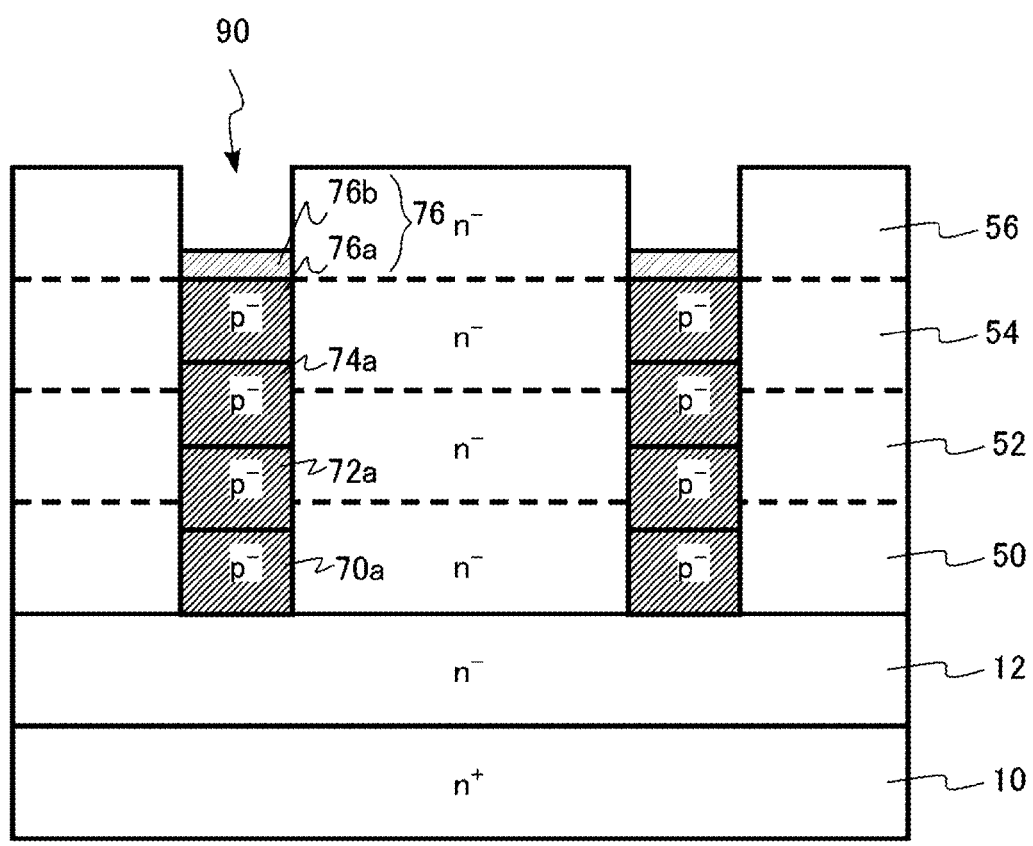

Next, the mask material is peeled off (FIG. 44). Next, activation annealing for activating the ion-implanted aluminum is performed.

Thereafter, the p type body region 18, the n$^+$ type source region 20, the p$^+$ type contact region 22, the gate insulating film 24, the gate electrode 26, the interlayer film 28, the source electrode 30, and the drain electrode 32 are formed by a conventional process.

The source electrode 30 is formed within the groove 90 which is formed in the surface of the surface layer 56. The MOSFET 200 illustrated in FIG. 33 is formed by the manufacturing method described above.

According to the present embodiment, the method of manufacturing a semiconductor device capable of realizing a high breakdown voltage is provided as in the first embodiment.

Further, a process of forming a trench for forming a trench contact by dry etching or the like is not necessary. Therefore, it is possible to easily manufacture a trench contact type MOSFET having an SJ structure.

Meanwhile, in the present embodiment, a description is given of an example in which a low impurity concentration region is selectively removed by thermal oxidation with respect to an epitaxial growth layer. However, for example, it is also possible to selectively remove the low impurity concentration region by dry etching with respect to an epitaxial growth layer. For example, it is also possible to remove a low impurity concentration region immediately after performing ion implantation using a mask material for the ion implantation of aluminum as a mask, and to form a groove in the surface of an epitaxial growth layer.

In the first to fifth embodiments, a description is given of an example in which 4H—SiC is used as a SiC crystal structure, but the exemplary embodiment can also be applied to devices using SiC with other crystal structures such as 6H—SiC and 3C—SiC. In addition, it is also possible to employ a SiC substrate having a surface other than the (0001) surface.

In the first to fifth embodiments, a description is given of an example in which a first conductivity type is an n type and a second conductivity type is a p type. However, the first conductivity type may be set as a p type, and the second conductivity type may be set as an n type.

In the first to fifth embodiments, aluminum (Al) is illustrated as a p type impurity, but it is also possible to use boron (B). In addition, nitrogen (N) is illustrated as an n type impurity, but it is also possible to apply phosphorus (P), arsenic (As), antimony (Sb), or the like.

In the first to fifth embodiments, a planar gate MOSFET is described as an example, but the exemplary embodiment can also be applied to a trench gate MOSFET.

In the first to fifth embodiments, a description is given of an example in which the number of epitaxial layers for forming a p$^-$ type pillar region 16 is three or more. However, the number of epitaxial layers is not limited to three, and any number of epitaxial layers may be used insofar as the number of epitaxial layers is two or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
   forming a second SiC layer of a first conductivity type on a first SiC layer by epitaxial growth;
   forming a first region of a second conductivity type by selectively ion-implanting first impurities of the second conductivity type into the second SiC layer;
   removing a portion of the first region;
   forming a third SiC layer of the first conductivity type on the second SiC layer by epitaxial growth; and
   forming a second region of the second conductivity type on the first region by selectively ion-implanting second impurities of the second conductivity type into the third SiC layer.

2. The method according to claim 1, wherein the removing of the portion of the first region is performed by chemical mechanical polishing (CMP).

3. The method according to claim 2, further comprising:
   after removing of the portion of the first region and before forming of the third SiC layer, removing a portion of the second SiC layer by anisotropic dry etching using a sulfur hexafluoride (SF$_6$) gas or a carbon tetrafluoride (CF$_4$) gas, or by isotropic dry etching.

4. The method according to claim 2, further comprising:
   after removing of the portion of the first region and before forming of the third SiC layer, removing a portion of the second SiC layer by forming a thermal oxide film on the second SiC layer and peeling off the thermal oxide film.

5. The method according to claim 2, further comprising:
   after removing of the portion of the first region and before forming of the third SiC layer, removing a portion of the second SiC layer by wet etching.

6. The method according to claim 1, wherein a portion of the first region is removed by forming a thermal oxide film on the first region and peeling off the thermal oxide film.

7. The method according to claim 1, wherein a portion of the first region is removed by dry etching.

8. The method according to claim 1, wherein when the portion of the first region is removed, a region including a peak concentration position of the first impurities is removed.

9. The method according to claim 1, wherein when the portion of the first region is removed, a groove is formed in a surface of the second SiC layer.

10. The method according to claim 1, wherein the first impurities and the second impurities are aluminum (Al).

11. A method of manufacturing a semiconductor device, the method comprising:
   forming a second SiC layer of a first conductivity type on a first SiC layer by epitaxial growth;
   forming a first region of a second conductivity type by selectively ion-implanting first impurities of the second conductivity type into the second SiC layer;
   forming a third SiC layer of the first conductivity type on the second SiC layer by epitaxial growth; and
   forming a second region of the second conductivity type on the first region by selectively ion-implanting second impurities of the second conductivity type into and through the third SiC layer so that a peak concentration position of the second impurities is in the first region.

12. The method according to claim 11, wherein the first impurities and the second impurities are aluminum (Al).

13. The method according to claim 11, wherein the ion-implanting of the second impurities is repeated until the peak concentration position of the second impurities is in the first region.

14. The method according to claim 11, further comprising:
   forming a fourth SiC layer of the first conductivity type on the third SiC layer by epitaxial growth; and
   forming a third region of the second conductivity type on the second region by selectively ion-implanting third impurities of the second conductivity type into and through the fourth SiC layer so that a peak concentration position of the third impurities is in the second region.

15. The method according to claim 14, wherein the ion-implanting of the third impurities is repeated until the peak concentration position of the third impurities is in the second region.

* * * * *